US008220563B2

(12) United States Patent
Bangaru et al.

(10) Patent No.: US 8,220,563 B2
(45) Date of Patent: *Jul. 17, 2012

(54) ULTRA-LOW FRICTION COATINGS FOR DRILL STEM ASSEMBLIES

(75) Inventors: Narasimha-Rao Venkata Bangaru, Pittstown, NJ (US); Swarupa Soma Bangaru, legal representative, Pittstown, NJ (US); Adnan Ozekcin, Bethlehem, PA (US); Hyun-Woo Jin, Easton, PA (US); Erika Ann Ooten Biediger, Houston, TX (US); Jeffrey Roberts Bailey, Houston, TX (US); Vishwas Gupta, Sugar Land, TX (US); Mehmet Deniz Ertas, Bethlehem, PA (US); William Curtis Elks, Jr., The Woodlands, TX (US)

(73) Assignee: ExxonMobil Research and Engineering Company, Annandale, NJ (US)

( * ) Notice: Subject to any disclaimer, the term of this patent is extended or adjusted under 35 U.S.C. 154(b) by 345 days.

This patent is subject to a terminal disclaimer.

(21) Appl. No.: 12/583,292

(22) Filed: Aug. 18, 2009

(65) Prior Publication Data
US 2010/0044110 A1    Feb. 25, 2010

Related U.S. Application Data

(60) Provisional application No. 61/189,530, filed on Aug. 20, 2008.

(51) Int. Cl.
*E21B 17/00* (2006.01)
(52) U.S. Cl. .......................... 175/57; 175/226; 175/320
(58) Field of Classification Search .................. 175/57, 175/226, 320; 166/902
See application file for complete search history.

(56) References Cited

U.S. PATENT DOCUMENTS

| 3,392,700 A | 7/1968 | Mallory |
| 4,171,560 A | 10/1979 | Garrett |
| 4,665,996 A | 5/1987 | Foroulis et al. |
| 4,945,991 A | 8/1990 | Jones |
| 5,113,935 A | 5/1992 | Jones et al. |

(Continued)

FOREIGN PATENT DOCUMENTS

EP    1 788 104 B1    11/2005
(Continued)

OTHER PUBLICATIONS

U.S. Appl. No. 12/583,302, filed Aug. 18, 2009, commonly owned co-pending application.

(Continued)

*Primary Examiner* — William P Neuder
(74) *Attorney, Agent, or Firm* — Robert A. Migliorini

(57) ABSTRACT

Provided are drill stem assemblies with ultra-low friction coatings for subterranean drilling operations. In one form, the coated drill stem assemblies for subterranean rotary drilling operations include a body assembly with an exposed outer surface including a drill string coupled to a bottom hole assembly or a coiled tubing coupled to a bottom hole assembly and an ultra-low friction coating on at least a portion of the exposed outer surface of the body assembly, wherein the coefficient of friction of the ultra-low friction coating is less than or equal to 0.15. The coated drill stem assemblies disclosed herein provide for reduced friction, vibration (stick-slip and torsional), abrasion and wear during straight hole or directional drilling to allow for improved rates of penetration and enable ultra-extended reach drilling with existing top drives.

89 Claims, 10 Drawing Sheets

U.S. PATENT DOCUMENTS

| | | |
|---|---|---|
| 5,163,524 A | 11/1992 | Newton, Jr. et al. |
| 5,541,003 A | 7/1996 | Nakayama et al. |
| 5,551,959 A | 9/1996 | Martin et al. |
| 5,626,963 A | 5/1997 | Hirano et al. |
| 5,629,086 A | 5/1997 | Hirano et al. |
| 5,653,812 A | 8/1997 | Petrmichl et al. |
| 5,692,563 A | 12/1997 | Krueger et al. |
| 5,707,717 A | 1/1998 | Shibahara et al. |
| 5,803,193 A | 9/1998 | Krueger et al. |
| 5,873,420 A | 2/1999 | Gearhart |
| 6,165,616 A | 12/2000 | Lemelson et al. |
| 6,209,185 B1 | 4/2001 | Scott |
| 6,250,405 B1 | 6/2001 | Moore et al. |
| 6,378,633 B1 | 4/2002 | Moore et al. |
| 6,450,271 B1 | 9/2002 | Tibitts et al. |
| 6,548,173 B2 | 4/2003 | Erdemir et al. |
| 6,708,783 B2 | 3/2004 | Moore et al. |
| 6,742,586 B2 | 6/2004 | Lauritzen et al. |
| 7,028,788 B2 | 4/2006 | Strand et al. |
| 7,052,736 B2 | 5/2006 | Wei et al. |
| 7,228,922 B1 | 6/2007 | DeVall |
| 7,234,541 B2 | 6/2007 | Scott et al. |
| 7,300,684 B2 | 11/2007 | Boardman et al. |
| 7,444,955 B2 | 11/2008 | Boardman et al. |
| 7,464,752 B2 | 12/2008 | Dale et al. |
| 7,487,840 B2 | 2/2009 | Gammage et al. |
| 7,541,069 B2 | 6/2009 | Tudhope et al. |
| 7,556,668 B2 | 7/2009 | Eason et al. |
| 7,673,679 B2 * | 3/2010 | Harrison et al. ......... 166/250.01 |
| 2001/0039305 A1 | 11/2001 | Nakamaru et al. |
| 2004/0031624 A1 | 2/2004 | Scott |
| 2004/0256236 A1 | 12/2004 | Minevski et al. |
| 2007/0092740 A1 | 4/2007 | Shi et al. |
| 2007/0209839 A1 | 9/2007 | Arnoldy |
| 2008/0127475 A1 | 6/2008 | Griffo |
| 2008/0166287 A1 | 7/2008 | Venkatraman et al. |
| 2008/0236842 A1 | 10/2008 | Bhavsar et al. |

FOREIGN PATENT DOCUMENTS

| | | |
|---|---|---|
| EP | 2 090 741 A1 | 8/2009 |
| GB | 2122224 A | 1/1984 |
| WO | WO 02/103161 A2 | 12/2002 |
| WO | WO2005/111264 | 11/2005 |
| WO | WO 2007/091054 A1 | 8/2007 |
| WO | WO2007/092082 | 8/2007 |
| WO | WO2007/092083 | 8/2007 |
| WO | WO2007/126496 | 11/2007 |
| WO | WO2008/060479 | 5/2008 |

OTHER PUBLICATIONS

Dudman, Rick A., West, Cory and Hubbard, Jeff, "Low-Stress Level PinUp Drillstring Optimizes Drilling of 20,000 ft. Slim-Hole in Southern Oklahoma", SPE/IADC Drilling Conference, Amsterdam, Holland, Mar. 9-11, 1999.

Dudman, R. A., Stull, T., and Keane, T., "Pin-up Drillstring Technology: Design, Application, and Case Histories", SPE/IADC Drilling Conference, New Orleans, Louisiana, Feb. 28-Mar. 3, 1989.

* cited by examiner

FIGURE 2
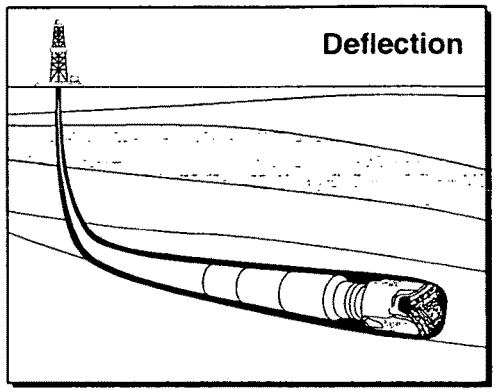
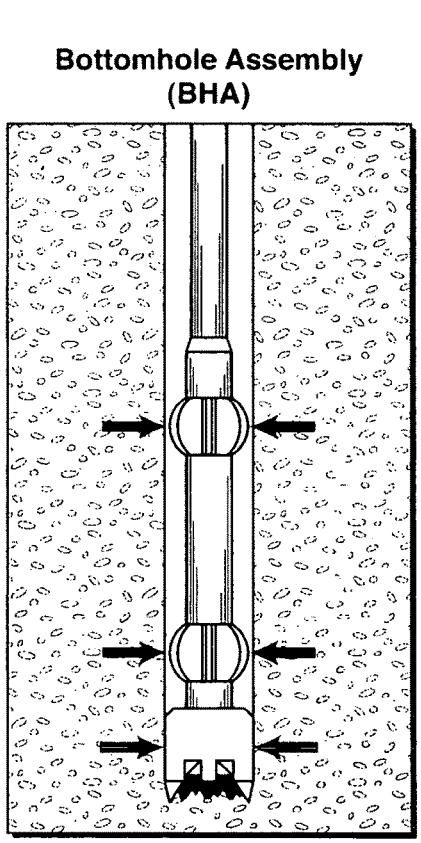
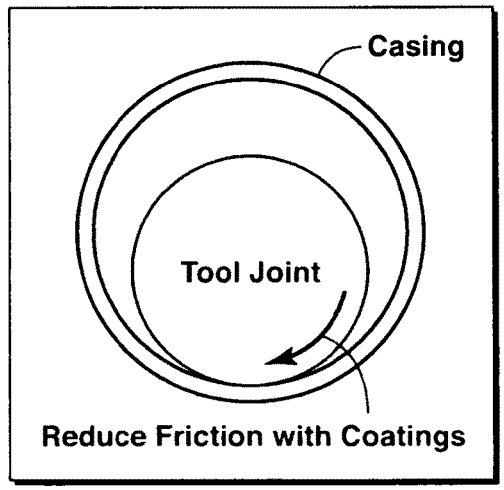

FIGURE 6
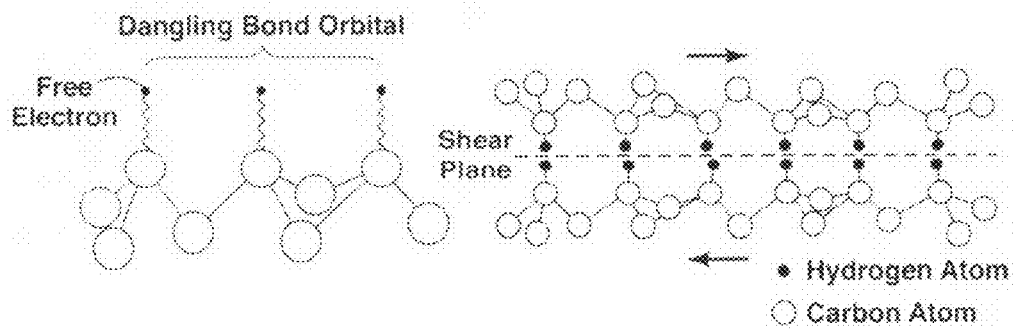
FIGURE 7
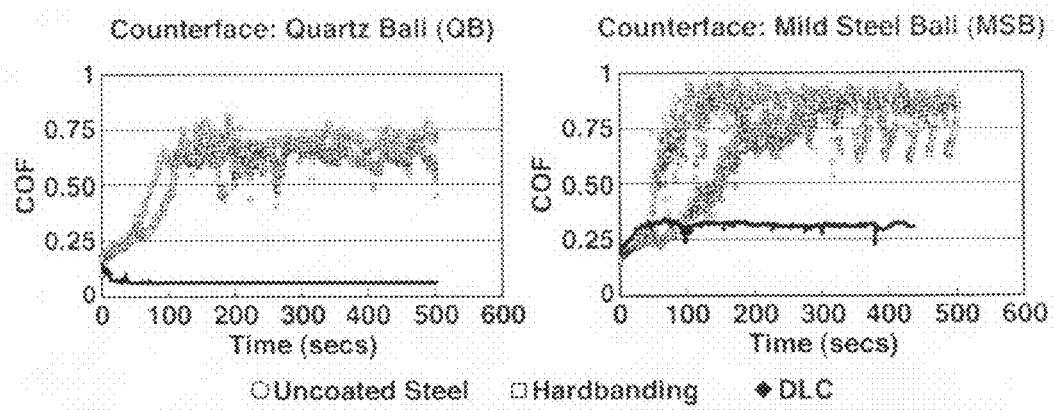
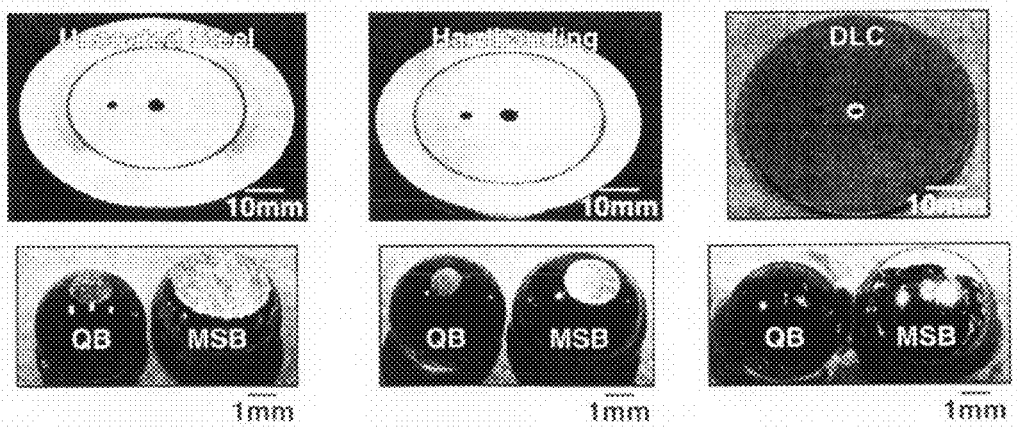

ULTRA-LOW FRICTION COATINGS FOR DRILL STEM ASSEMBLIES

CROSS-REFERENCE TO RELATED APPLICATIONS

This is a Non-Provisional Application that claims priority to U.S. Provisional Application 61/189,530 filed Aug. 20, 2008, which is herein incorporated by reference in its entirety.

FIELD

The present invention relates to the field of rotary drilling. It more particularly relates to ultra-low friction coatings and the use of such coatings on drill stem assemblies to reduce friction and wear during subterraneous rotary drilling operations.

BACKGROUND

In rotary drilling operations, a drill bit is attached to the end of a bottom hole assembly which is attached to a drill string comprising drill pipe and tool joints which may be rotated at the surface by a rotary table or top drive unit. The weight of the drill string and bottom hole assembly causes the rotating bit to bore a hole in the earth. As the operation progresses, new sections of drill pipe are added to the drill string to increase its overall length. Periodically during the drilling operation, the open borehole is cased to stabilize the walls, and the drilling operation is resumed. As a result, the drill string usually operates both in the open borehole and within the casing which has been installed in the borehole. Alternatively, coiled tubing may replace drill string in the drilling assembly. The combination of a drill string and bottom hole assembly or coiled tubing and bottom hole assembly is referred to herein as a drill stem assembly. Rotation of the drill string provides power through the drill string and bottom hole assembly to the bit. In coiled tubing drilling, power is delivered to the bit by the drilling fluid pumps. The amount of power which can be transmitted by rotation is limited to the maximum torque a drill string or coiled tubing can sustain.

During the drilling of a borehole through underground formations, the drill stem assembly undergoes considerable sliding contact with both the steel casing and rock formations. This sliding contact results primarily from the rotational and axial movements of the drill stem assembly in the borehole. Friction between the moving surface of the drill stem assembly and the stationary surfaces of the casing and formation creates considerable drag on the drill stem and results in excessive torque and drag during drilling operations. The problem caused by friction is inherent in any drilling operation, but it is especially troublesome in directionally drilled wells or extended reach drilling (ERD) wells. Directional drilling or ERD is the intentional deviation of a wellbore from the vertical. In some cases the angle from the vertical may be as great as ninety degrees from the vertical. Such wells are commonly referred to as horizontal wells and may be drilled to a considerable depth and considerable distance from the drilling platform.

In all drilling operations, the drill stem assembly has a tendency to rest against the side of the borehole or the well casing, but this tendency is much greater in directionally drilled wells because of the effect of gravity. As the drill string increases in length or degree of vertical deflection, the amount of friction created by the rotating drill stem assembly also increases. To overcome this increase in friction, additional power is required to rotate the drill stem assembly. In some cases, the friction between the drill stem assembly and the casing wall or borehole exceeds the maximum torque that can be tolerated by the drill stem assembly and/or maximum torque capacity of the drill rig and drilling operations must cease. Consequently, the depth to which wells can be drilled using available directional drilling equipment and techniques is limited.

One method for reducing the friction caused by the contact between the drill stem assembly and casing (in case of a cased hole) or borehole (in case of an open hole) is improving the lubricity of drilling muds. In industry drilling operations, attempts have been made to reduce friction through, mainly, using water and/or oil based mud solutions containing various types of expensive and often environmentally unfriendly additives. Diesel and other mineral oils are also often used as lubricants, but there is a problem with the disposal of the mud. Certain minerals such as bentonite are known to help reduce friction between the drill stem assembly and an open borehole. Materials such as Teflon have been used to reduce friction, however these lack durability and strength. Other additives include vegetable oils, asphalt, graphite, detergents and walnut hulls, but each has its own limitations.

Another method for reducing the friction between the drill stem assembly and the well casing or borehole is to use aluminum drill string because aluminum is lighter than steel. However, the aluminum drill string is expensive and is difficult to use in drilling operations, and it is not compatible with many types of drilling fluids (e. g. drilling fluids with high pH).

Yet another method for reducing the friction between the drill stem assembly and the well casing or borehole is to use a hard facing material on the drill string assembly (also referred to herein as hardbanding or hardfacing). U.S. Pat. No. 4,665,996, herein incorporated by reference in its entirety, discloses the use of hardfacing the principal bearing surface of a drill pipe with an alloy having the composition of: 50-65% cobalt, 25-35% molybdenum, 1-18% chromium, 2-10% silicon and less than 0.1% carbon for reducing the friction between the drill string and the casing or rock. As a result, the torque needed for the rotary drilling operation, especially directional drilling, is decreased. The disclosed alloy also provides excellent wear resistance on the drill string while reducing the wear on the well casing. Another form of hardbanding is WC-cobalt cermets applied to the drill stem assembly. Other hardbanding materials include TiC, Cr-carbide, and other mixed carbide and nitride systems. Hardbanding may be applied to portions of the drill stem assembly using weld overlay or thermal spray methods.

Still another problem encountered during subterraneous rotary drilling operations, especially directional drilling, is the wear on the casing and drill stem assembly that occurs when the metal surfaces contact each other. This abrasion between metal surfaces during the drilling of oil and gas wells results in excessive wear on both the drill stem assembly and the well casing. Presently, one preferred solution to reduce wear of drill stem assemblies is to hardface portions of the drill stem assembly. A tungsten carbide containing alloy, such as Stellite 6 and Stellite 12 (trademark of Cabot Corporation), has excellent wear resistance as a hardfacing material. Hardfacing protects the drill stem assembly, but it tends to cause excessive abrading of the well casing. This problem is especially severe during directional drilling because the drill stem assembly, which has a tendency to rest on the well casing, continually abrades the well casing as the drill string rotates. In addition, some of these hardfacing alloys, such as tungsten carbide, may make the friction problem worse.

Hence, there is a need for new coating/material technologies that are casing-friendly while protecting the drill stem assembly from wear and at the same time lowering contact friction in cased hole drilling conditions. This requires novel materials that combine high hardness with a capability for low coefficient of friction (COF) when in contact with the casing steel surface. If such coating/material can also provide a low energy surface and low COF against borehole wall, then that may be an enabler for ultra-extended reach drilling.

SUMMARY

According to the present disclosure, an advantageous coated drill stem assembly for subterraneous rotary drilling operations comprises a body assembly with an exposed outer surface including a drill string coupled to a bottom hole assembly or a coiled tubing coupled to a bottom hole assembly and an ultra-low friction coating on at least a portion of the exposed outer surface of the body assembly, wherein the coefficient of friction of the ultra-low friction coating is less than or equal to 0.15.

A further aspect of the present disclosure relates to an advantageous method for reducing friction in a coated drill stem assembly during subterraneous rotary drilling operations comprising: providing a coated drill stem assembly comprising a body assembly with an exposed outer surface including a drill string coupled to a bottom hole assembly or a coiled tubing coupled to a bottom hole assembly, and an ultra-low friction coating on at least a portion of the exposed outer surface of the body assembly, wherein the coefficient of friction of the ultra-low friction coating is less than or equal to 0.15, and utilizing the coated drill stem assembly in subterraneous rotary drilling operations.

A still further aspect of the present disclosure relates to an advantageous coated drill stem assembly for subterraneous rotary drilling operations comprising: a body assembly with an exposed outer surface including a drill string coupled to a bottom hole assembly or a coiled tubing coupled to a bottom hole assembly, hardbanding on at least a portion of the exposed outer surface of the body assembly, and an ultra-low friction coating on at least a portion of the hardbanding, wherein the coefficient of friction of the ultra-low friction coating is less than or equal to 0.15.

A still yet further aspect of the present disclosure relates to an advantageous method for reducing friction in a coated drill stem assembly during subterraneous rotary drilling operations comprising: providing a drill stem assembly comprising a body assembly with an exposed outer surface including a drill string coupled to a bottom hole assembly or a coiled tubing coupled to a bottom hole assembly, hardbanding on at least a portion of the exposed outer surface of the body assembly, and an ultra-low friction coating on at least a portion of the hardbanding, wherein the coefficient of friction of the ultra-low friction coating is less than or equal to 0.15, and utilizing the coated drill stem assembly in subterraneous rotary drilling operations.

These and other features and attributes of the disclosed coated drill stem assembly, methods for reducing friction in a coated drill stem assembly for subterraneous rotary drilling operations, and their advantageous applications and/or uses will be apparent from the detailed description which follows, particularly when read in conjunction with the figures appended hereto.

BRIEF DESCRIPTION OF DRAWINGS

To assist those of ordinary skill in the relevant art in making and using the subject matter hereof, reference is made to the appended drawings, wherein:

FIG. 2 depicts exemplary applications of the ultra-low friction coatings disclosed herein in subterreaneous drilling applications.

FIG. 6 depicts a schematic illustration of the hydrogen dangling bond theory.

FIG. 7 depicts the friction and wear performance of DLC coating at dry sliding wear test.

DEFINITIONS

Figure 1:
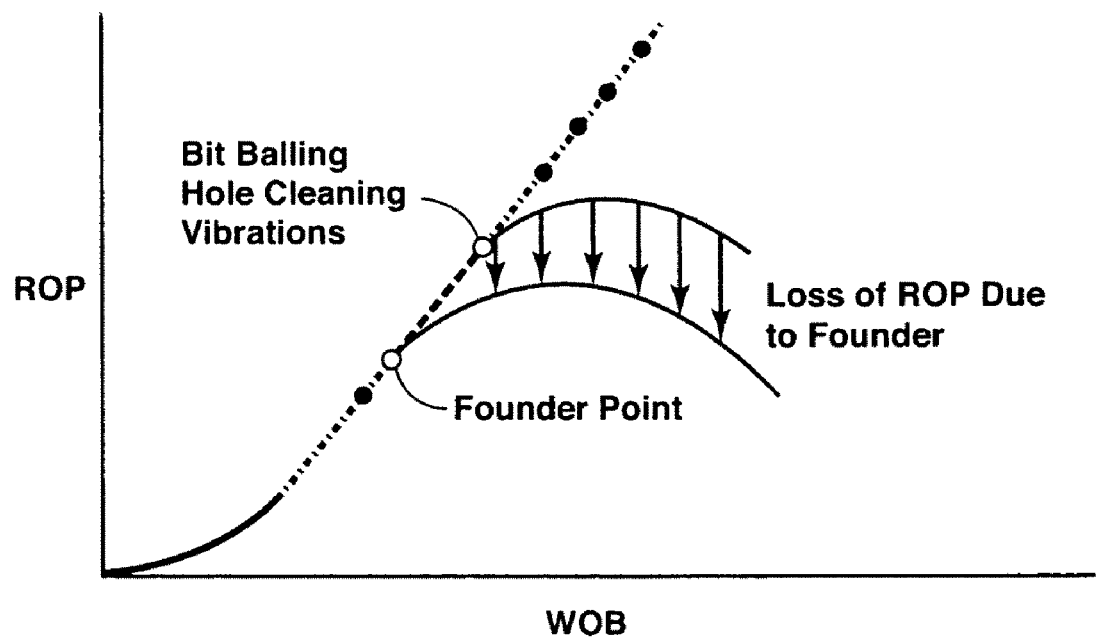
FIG. 1 depicts, schematically, the rate of penetration (ROP) versus weight on bit (WOB) during subterraneous rotary drilling.

Drill string is defined as the column, or string of drill pipe with attached tool joints, transition pipe between the drill string and bottom hole assembly including tool joints, heavy weight drill pipe including tool joints and wear pads that transmits fluid and rotational power from the kelly to the drill collars and the bit. Often, especially in the oil patch, the term is loosely applied to include both drill pipe and drill collars. The drill string does not include the drill bit.

Drill stem is defined as the entire length of tubular pipes, composed of the kelly, the drill pipe, and drill collars, that make up the drilling assembly from the surface to the bottom of the hole. The drill stem does not include the drill bit.

Bottom hole assembly (BHA) is defined as one or more components, including but not limited to: stabilizers, variable-gauge stabilizers, back reamers, drill collars, flex drill collars, rotary steerable tools, roller reamers, shock subs, mud motors, logging while drilling (LWD) tools, measuring while drilling (MWD) tools, coring tools, under-reamers, hole openers, centralizers, turbines, bent housings, bent motors, drilling jars, acceleration jars, crossover subs, bumper jars, torque reduction tools, float subs, fishing tools, fishing jars, washover pipe, logging tools, survey tool subs, non-magnetic counterparts of these components, associated external connections of these components, and combinations thereof.

Drill stem assembly is defined as a combination of a drill string and bottom hole assembly or coiled tubing and bottom hole assembly. The drill stem assembly does not include the drill bit.

DETAILED DESCRIPTION

All numerical values within the detailed description and the claims herein are modified by "about" or "approximately"

the indicated value, and take into account experimental error and variations that would be expected by a person having ordinary skill in the art.

Overview of Use of Ultra-Low Friction Coatings and Associated Benefits:

Deep wells for the exploration and production of oil and gas are drilled with a rotary drilling system which creates a borehole by means of a rock cutting tool, drill bit. The torque driving the bit is often generated at the surface by a motor with mechanical transmission box. Via the transmission, the motor drives the rotary table or top drive unit. The medium to transport the energy from the surface to the drill bit is a drill string (abbreviated herein as DS), mainly consisting of drill pipes. The lowest part of the drill string is the bottom hole assembly (abbreviated herein as BHA) consisting of drill collars, stabilizers and others including measurement devices, under-reamers, and motors. The combination of the drill string and the bottom hole assembly is referred to herein as a drill stem assembly. Alternatively, coiled tubing may replace the drill string, and the combination of coiled tubing and the bottom hole assembly is also referred to herein as a drill stem assembly. The bottom hole assembly is connected to the drill bit at the drilling end.

For the case of a drill stem assembly including a drill string, periodically during drilling operations, new sections of drill pipe are added to the drill stem, and the upper sections of the borehole are normally cased to stabilize the wells, and drilling is resumed. Thus, the drill stem assembly (drill string/BHA) undergoes various types of friction and wear caused by interaction between the drill string/BHA/bit and the casing ("cased hole" part of the borehole) or the rock cuttings and mud in the annulus or drill string/BHA/bit with open borehole ("open hole" part of the borehole).

The trend in drilling is deeper and harder formations where the low rate of penetration (abbreviated herein as ROP) leads to high drilling costs. In other areas such as deep shale drilling, bottom hole balling may occur wherein shale cuttings stick to the bit cutting face by differential mud pressure across the cuttings-mud and cuttings-bit face, reducing drilling efficiencies and ROP significantly. Sticking of cuttings to the BHA components such as stabilizers can also lead to drilling inefficiencies.

Drill stem assembly friction and wear are important causes for premature failure of drill string or coiled tubing and the associated drilling inefficiencies. Stabilizer wear can affect the borehole quality in addition to leading to vibrational inefficiencies. These inefficiencies can manifest themselves as ROP limiters or "founder points" in the sense that the ROP does not increase linearly with weight on bit (abbreviated herein as WOB) and revolutions per minute (abbreviated herein as RPM) of the bit as predicted from bit mechanics. This limitation is depicted schematically in FIG. 1.

It has been recognized in the drilling industry that drill stem vibrations and bit balling are two of the most challenging rate of penetration limiters. The ultra-low friction coatings disclosed herein when applied to the drill stem assembly help to mitigate these ROP limitations.

The deep drilling environment, especially in hard rock formations, induces severe vibrations in the drill stem assembly, which can cause reduced drill bit rate of penetration and premature failure of the equipment downhole. The two main vibration excitation sources are interactions between drill bit and rock formation, and between the drill stem assembly and wellbore or casing. As a consequence, the drill stem assembly vibrates axially, torsionally, laterally or usually with a combination of these three basic modes, that is, coupled vibrations. Therefore, this leads to a complex problem. A particularly challenging form of drill stem assembly vibration is stick-slip vibration mode, which is a manifestation of torsional instability. The static contact friction of various drill stem assembly components with the casing/borehole, and also the dynamic response of this contact friction as function of rotary speed may be important for the onset of stick-slip vibrations. For example, it is suggested that the bit induced stick-slip torsional instability may be triggered by velocity weakening of contact friction at the bit-borehole surfaces wherein the dynamic contact friction is lower than static friction.

With today's advanced technology offshore drilling allows multi-lateral well drilling to be performed with the same starter well. This may mean drilling over far longer depths and the use of directional drilling technology, e.g., through the use of rotary steerable systems (abbreviated herein as RSS). Although this gives major cost and logistical advantages it also greatly increases wear on the drill string and casing. In some cases of directional or extended reach drilling, the degree of vertical deflection, angle from the vertical, can be as great as 90°, which are commonly referred to as horizontal wells. In drilling operations, the drill string assembly has a tendency to rest against the side wall of borehole or the well casing. This tendency is much greater in directional wells due to gravity effect. As the drill string increases in length and/or degree of deflection the overall frictional drag created by rotating the drill string also increases. To overcome this increase in frictional drag, additional power is required to rotate the drill string. The resultant wear and the string/casing friction (cased hole) are critical to the drilling efficiency operation. The measured depth that can be achieved in these situations is often limited by the available torque capacity of the drilling rig. There is a need to find more efficient solutions to extend equipment lifetime and drilling capabilities with existing rigs and drive mechanisms to extend the lateral reach of the extended reach drilling. The high contact friction in these applications leads to high torque and drag which can limit the reach in extended reach drilling. It has been discovered that coating portions or all of the drill stem assembly with ultra-low friction coating may resolve these issues. FIG. 2 depicts areas of the drill stem assembly where the ultra-low friction coatings disclosed herein may be applied to reduce friction.

Another aspect of the instant invention relates to the use of ultra-low friction coatings to improve the performance of drilling tools, particularly a drilling head for drilling in formations containing clay and similar substances. The present invention utilizes the low surface energy novel materials or coating systems to provide thermodynamically low energy surfaces, e.g., non-water wetting surface for bottom hole components. The ultra-low friction coatings disclosed herein are suitable for oil and gas drilling in gumbo-prone areas, such as in deep shale drilling with high clay contents using water-based muds (abbreviated herein as WBM) to prevent drill bit and bottom hole assembly component balling.

Furthermore, the ultra-low friction coatings disclosed herein when applied to the drill string assembly can simultaneously reduce contact friction, bit balling and reduce wear while not compromising the durability and mechanical integrity of casing in the cased hole situation. Thus, the ultra-low friction coatings disclosed herein are "casing friendly" in that they do not degrade the life or functionality of the casing. The ultra-low friction coatings disclosed herein are also characterized by low or no sensitivity to velocity weakening friction behavior. Thus, the drill stem assemblies provided with the ultra-low friction coatings disclosed herein provide low friction surfaces with advantages in both mitigating stick-slip vibrations and reducing parasitic torque to further enable ultra-extended reach drilling.

The ultra-low friction coatings disclosed herein for drill stem assemblies provide for the following exemplary non-limiting advantages: i) mitigating stick-slip vibrations, ii) reducing torque and drag for extending the reach of extended reach wells and iii) mitigating drill bit and other bottom hole component balling. These three advantages together with minimizing the parasitic torque may lead to significant improvements in drilling rate of penetration as well as durability of downhole drilling equipment, thereby also contributing to reduced non-productive time (abbreviated herein as NPT). The ultra-low friction coatings disclosed herein not only reduce friction, but also withstand the aggressive downhole drilling environments requiring chemical stability, corrosion resistance, impact resistance, durability against wear, erosion and mechanical integrity (coating-substrate interface strength). The ultra-low friction coatings disclosed herein are also amenable for application to complex shapes without damaging the substrate properties. Moreover, the ultra-low friction coatings disclosed herein also provide low energy surfaces necessary to provide resistance to balling of bottom hole components.

Exemplary Embodiments of the Current Invention

In one exemplary embodiment of the current invention, a coated drill stem assembly for subterraneous rotary drilling operations includes a body assembly with an exposed outer surface including a drill string coupled to a bottom hole assembly or a coiled tubing coupled to a bottom hole assembly and an ultra-low friction coating on at least a portion of the exposed outer surface of the body assembly, wherein the coefficient of friction of the ultra-low friction coating is less than or equal to 0.15. In alternative forms of this embodiment, the coefficient of friction of the ultra-low friction coating may be less than or equal to 0.13, or 0.11, or 0.09 or 0.07 or 0.05. The friction force may be calculated as follows: Friction Force=Normal Force×Coefficient of Friction. In another form, the coated drill stem assembly for subterraneous rotary drilling operations may have a dynamic friction coefficient of the ultra-low friction coating that is not lower than 50%, or 60%, or 70%, or 80% or 90% of the static friction coefficient of the ultra-low friction coating. In yet another form, the coated drill stem assembly for subterraneous rotary drilling operations may have a dynamic friction coefficient of the ultra-low friction coating that is greater than or equal to the static friction coefficient of the ultra-low friction coating.

The drill stem assembly for coating may be iron based steels, Al-base alloys, Ni-base alloys and Ti-base alloys. 4142 type steel is one non-limiting exemplary iron based steel used for drill stem assembly components. The surface of the iron based steel substrate may be optionally subjected to an advanced surface treatment prior to ultra-low friction coating application. The advanced surface treatment may provide one or more of the following benefits: extended durability, enhanced wear, reduced friction coefficient, enhanced fatigue and extended corrosion performance of the ultra-low friction coating layer(s). Non-limited exemplary advanced surface treatments include ion implantation, nitriding, carburizing, shot peening, laser and electron beam glazing, laser shock peening, and combinations thereof. Such surface treatments may harden the substrate surface by introducing additional species and/or introduce deep compressive residual stress resulting in inhibition of the crack growth induced by fatigue, impact and wear damage.

The ultra-low friction coating disclosed herein may be chosen from an amorphous alloy, an electroless nickel-phosphorous composite, graphite, $MoS_2$, $WS_2$, a fullerene based composite, a boride based cermet, a quasicrystalline material, a diamond based material, diamond-like-carbon (DLC), boron nitride, and combinations thereof. The diamond based material may be chemical vapor deposited (CVD) diamond or polycrystalline diamond compact (PDC). In one advantageous embodiment, the coated drill stem assembly for subterraneous rotary drilling operations is coated with an ultra-low friction diamond-like-carbon (DLC) coating, and more particularly the DLC coating may be chosen from tetrahedral amorphous carbon (ta-C), tetrahedral amorphous hydrogenated carbon (ta-C:H), diamond-like hydrogenated carbon (DLCH), polymer-like hydrogenated carbon (PLCH), graphite-like hydrogenated carbon (GLCH), silicon containing diamond-like carbon (Si-DLC), metal containing diamond-like carbon (Me-DLC), oxygen containing diamond-like carbon (O-DLC), nitrogen containing diamond-like carbon (N-DLC), boron containing diamond-like carbon (B-DLC), fluorinated diamond-like carbon (F-DLC) and combinations thereof.

Significantly decreasing the coefficient of friction (COF) of the drill stem assembly will result in a significant decrease in the friction force. This translates to a smaller force required to slide the cuttings along the surface of the coated drill stem assembly. If the friction force is low enough, it may be possible to increase the mobility of cuttings along the surface until they can be lifted off the surface of the drill stem assembly or transported to the annulus. It is also possible that the increased mobility of the cuttings along the surface may inhibit the formation of differentially stuck cuttings due to the differential pressure between mud and mud-squeezed cuttings-cutter interface region holding the cutting onto the cutter face. Lowering the COF on drill stem assembly component surfaces is accomplished by coating these surfaces with ultra-low friction coatings disclosed herein. These ultra-low friction coatings coated onto the drill stem assembly are able to withstand the aggressive environments of drilling including resistance to corrosion, impact loading and exposure to high temperatures.

Figure 3:
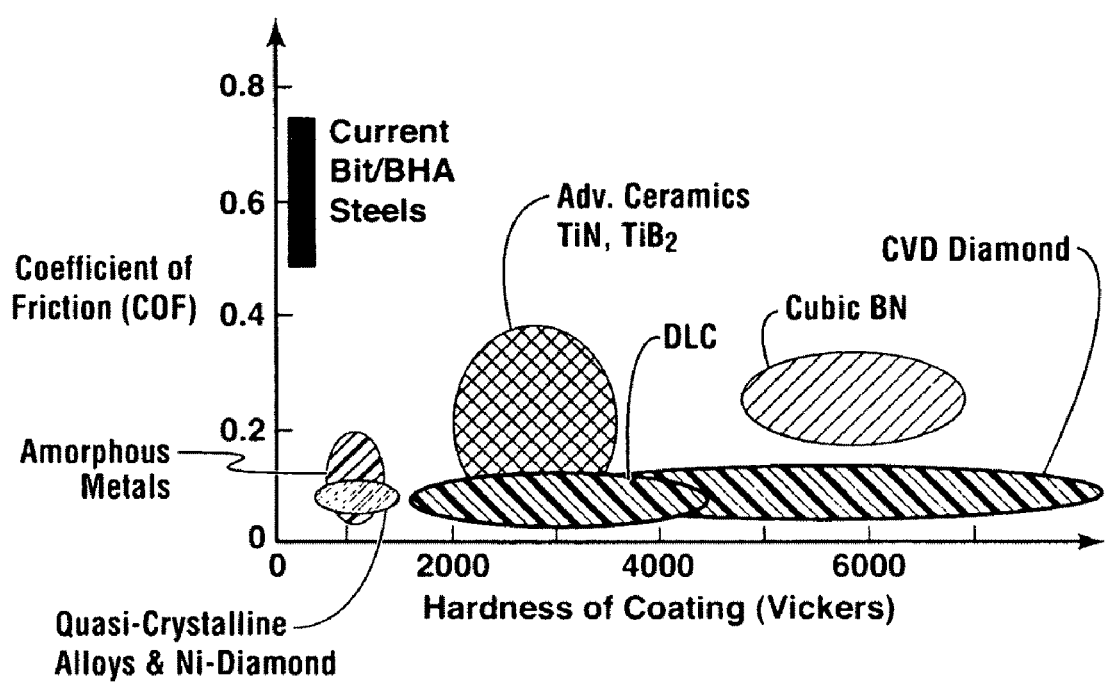
FIG. 3 depicts the relationship between coating COF and coating hardness for some of the ultra-low friction coatings disclosed herein versus steel base case.

In addition to ultra-low COF, the coatings of the present invention are also of sufficiently high hardness to withstand durability against wear during drilling operations. More particularly, the Vickers hardness or the equivalent Vickers hardness of the ultra-low friction coatings on the drill stem assemblies disclosed herein may be greater than or equal to 400, 500, 600, 700, 800, 900, 1000, 1500, 2000, 2500, 3000, 3500, 4000, 4500, 5000, 5500, or 6000. A Vickers hardness of greater than 400 allows for the coated drill stem assembly of the current invention to be used for drilling in shales with water based muds and the use of spiral stabilizers. FIG. 3 depicts the relationship between coating COF and coating hardness for some of the ultra-low friction coatings disclosed herein relative to the prior art drill string/BHA steels. The combination of low COF and high hardness for the ultra-low friction coatings disclosed herein when used as a surface coating on the drill stem assemblies provides for hard, low COF durable materials for downhole drilling applications.

The coated drill stem assembly with the ultra-low friction coatings disclosed herein also provides a surface energy less than 1, 0.9, 0.8, 0.7, 0.6, 0.5, 0.4, 0.3, 0.2, or 0.1 $J/m^2$ to mitigate sticking or balling by rock cuttings during subterraneous rotary drilling operations. Contact angle may also be used to quantify the surface energy of the ultra-low friction coatings on the coated drill stem assemblies disclosed herein.

The water contact angle of the ultra-low friction coatings disclosed herein is greater than 50, 60, 70, 80, or 90 degrees.

Figure 4:
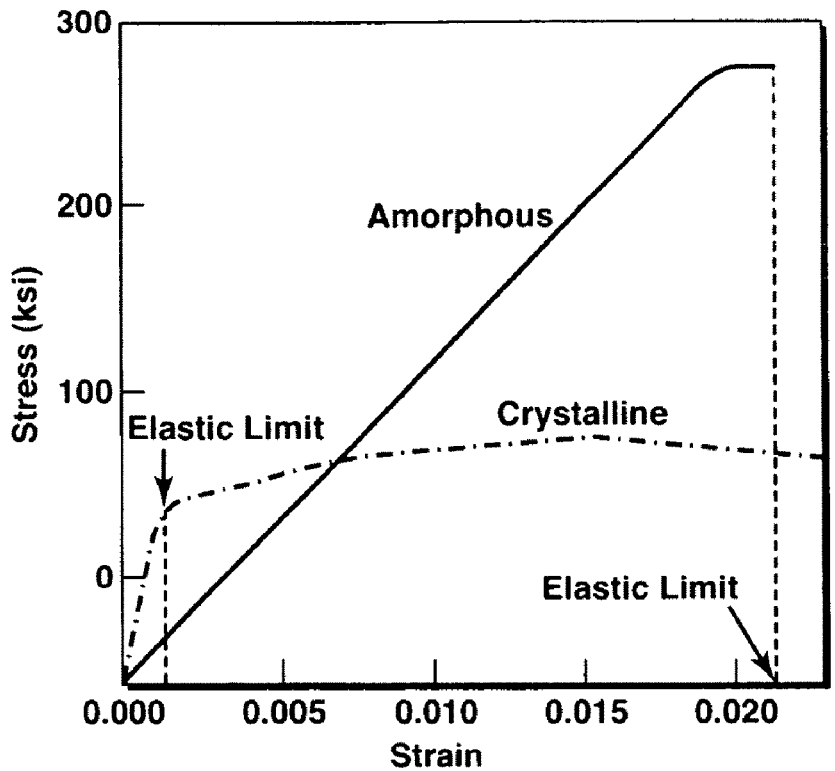
FIG. 4 depicts a representative stress-strain curve showing the high elastic limit of amorphous alloys compared to that of crystalline metals/alloys.

Further details regarding the ultra-low friction coatings disclosed herein for use in drill stem assemblies are as follows:

Ultra-Low Friction Amorphous Alloys:

Amorphous alloys as ultra-low friction coatings for drill stem assemblies disclosed herein provide high elastic limit/flow strength with relatively high hardness. These attributes allow these materials, when subjected to stress or strain, to stay elastic for higher strains/stresses as compared to the crystalline materials such as the steels used in drill stem assemblies. The stress-strain relationship between the amorphous alloys as ultra-low friction coatings for drill stem assemblies and conventional crystalline alloys/steels is depicted in FIG. 4, and shows that conventional crystalline alloys/steels can easily transition into plastic deformation at relatively low strains/stresses in comparison to amorphous alloys. Premature plastic deformation at the contacting surfaces leads to surface asperity generation and the consequent high asperity contact forces and COF in crystalline metals. The high elastic limit of amorphous metallic alloys or amorphous materials in general can reduce the formation of asperities resulting also in significant enhancement of wear resistance. Amorphous alloys as ultra-low friction coatings for drill stem assemblies would result in reduced asperity formation during drilling operation and thereby reduced COF of the drill stem assembly.

Amorphous alloys as ultra-low friction coatings for drill stem assemblies may be deposited using a number of coating techniques including, but not limited to, thermal spraying, cold spraying, weld overlay, laser beam surface glazing, ion implantation and vapor deposition. Using a scanned laser or electron beam, a surface can be glazed and cooled rapidly to form an amorphous surface layer. In glazing, it may be advantageous to modify the surface composition to ensure good glass forming ability and to increase hardness and wear resistance. This may be done by alloying into the molten pool on the surface as the heat source is scanned. Hardfacing coatings may be applied also by thermal spraying including plasma spraying in air or in vacuum. Thinner, fully amorphous coatings as ultra-low friction coatings for drill stem assemblies may be obtained by thin film deposition techniques including, but not limited to, sputtering, chemical vapor deposition (CVD) and electrodeposition. Some amorphous alloy compositions disclosed herein, such as near equiatomic stoichiometry (e.g., Ni—Ti), may be amorphized by heavy plastic deformation such as shot peening or shock loading. The amorphous alloys as ultra-low friction coatings for drill stem assemblies disclosed herein yield an outstanding balance of wear and friction performance and require adequate glass forming ability for the production methodology to be utilized.

Ultra-Low Friction Electroless Ni—P Composite Coatings:

Electroless nickel-phosphorous (Ni—P) composites as ultra-low friction coatings for drill stem assemblies disclosed herein may be formed by codeposition of inert particles onto a metal matrix from an electrolytic or electroless bath. Ni—P-diamond composite coating is a cost effective coating method since it is based on commercial electroless Ni plating process. The Ni—P composite coating provides excellent adhesion to most metal and alloy substrates. The final properties of these coatings depend on the phosphorous content of the Ni—P matrix, which determines the structure of the coatings, and on the characteristics of the embedded particles such as type, shape and size. The ultra-low friction nickel-phosphorous (Ni—P) composite coating disclosed herein may include micron-sized particles.

Ultra-Low Friction Layered Materials and Novel Fullerene Based Composite Coating Layers:

Layered materials such as graphite, $MoS_2$ and $WS_2$ (platelets of the 2H polytype) may be used as ultra-low friction coatings for drill stem assemblies. In addition, fullerene based composite coating layers which include fullerene-like nanoparticles may also be used as ultra-low friction coatings for drill stem assemblies. Fullerene-like nanoparticles have advantageous tribological properties in comparison to typical metals while alleviating the shortcomings of conventional layered materials (e.g., graphite, $MoS_2$). Nearly spherical fullerenes may also behave as nanoscale ball bearings. The main favorable benefit of the hollow fullerene-like nanoparticles may be attributed to the following three effects, (a) rolling friction, (b) the fullerene nanoparticles function as spacers, which eliminate metal to metal contact between the asperities of the two mating metal surfaces, and (c) three body material transfer. Sliding/rolling of the fullerene-like nanoparticles in the interface between rubbing surfaces may be the main friction mechanism at low loads, when the shape of nanoparticle is preserved. The beneficial effect of fullerene-like nanoparticles increases with the load. Exfoliation of external sheets of fullerene-like nanoparticles was found to occur at high contact loads (~1 GPa). The transfer of delaminated fullerene-like nanoparticles appears to be the dominant friction mechanism at severe contact conditions. The mechanical and tribological properties of fullerene-like nanoparticles can be exploited by the incorporation of these particles in binder phases of coating layers. In addition, composite coatings incorporating fullerene-like nanoparticles in a metal binder phase (e.g., Ni—P electroless plating) can provide a film with self-lubricating and excellent anti-sticking characteristics suitable for ultra-low friction coatings for drill stem assemblies.

Advanced Boride Based Cermets and Metal Matrix Composites:

Advanced boride based cermets and metal matrix composites as ultra-low friction coatings for drill stem assemblies may be formed on bulk materials due to high temperature exposure either by heat treatment or incipient heating during wear service. For instance, boride based cermets (e.g., TiB2-metal), the surface layer is typically enriched with boron oxide (e.g, $B_2O_3$) which enhances lubrication performance leading to low friction coefficient.

Quasicrystalline Materials:

Quasicrystalline materials may be used as ultra-low friction coatings for drill stem assemblies. Quasicrystalline materials have periodic atomic structure, but do not conform to the 3-D symmetry typical of ordinary crystalline materials. Due to their crystallographic structure, most commonly icosahedral or decagonal, quasicrystalline materials with tailored chemistry exhibit unique combination of properties including low energy surfaces, attractive as a coating material for drill stem assemblies. Quasicrystalline materials provide non-stick surface properties due to their low surface energy (~30 $mJ/m^2$) on stainless steel substrate in icosahedral Al—Cu—Fe chemistries. Quasicrystalline materials as coating layers for drill stem assemblies may provide a combination of low friction coefficient (~0.05 in scratch test with diamond indentor in dry air) with relatively high microhardness (400~600 HV) for wear resistance. Quasicrystalline materials as coating layers for drill stem assemblies may also provide a low corrosion surface and the coated layer has smooth and flat surface with low surface energy for improved drilling performance. Quasicrystalline materials may be deposited on a metal substrate by a wide range of coating technologies, including, but not limited to, thermal spraying, vapor deposition, laser cladding, weld overlaying, and electrodeposition.

Super-Hard Materials (Diamond, Diamond-Like-Carbon, Cubic Boron Nitride):

Super-hard materials such as diamond, diamond-like-carbon (DLC) and cubic boron nitride (CBN) may be used as ultra-low friction coatings for drill stem assemblies. Diamond is the hardest material known to man and under certain conditions may yield ultra-low coefficient of friction when deposited by chemical vapor deposition (abbreviated herein as CVD) on drill stem assembly components. In one form, the CVD deposited carbon may be deposited directly on the surface of the drill stem assembly. In another form, an undercoating of a compatibilizer material (also referred to herein as a buffer layer) may be applied to the drill stem assembly prior to diamond deposition. An ultra-low friction surface coating of CVD diamond may also provide not only reduced tendency for sticking of cuttings at the surface of drill stem assembly components, but also function as an enabler for using spiral stabilizers in operations with gumbo prone drilling (such as for example in the Gulf of Mexico). Coating the flow surface of the spiral stabilizers with CVD diamond may enable the cuttings to flow past the stabilizer up hole into the drill string annulus without sticking to the stabilizer.

In one advantageous embodiment, diamond-like-carbon (DLC) may be used as ultra-low friction coatings for drill stem assemblies. DLC refers to amorphous carbon materials that display some of the unique properties similar to that of natural diamond. The diamond-like-carbon (DLC) suitable for drill stem assemblies may be chosen from ta-C, ta-C:H, DLCH, PLCH, GLCH, Si-DLC, Me-DLC, N-DLC, O-DLC, B-DLC, F-DLC and combinations thereof. DLC coatings include significant amounts of $sp^3$ hybridized carbon atoms. These $sp^3$ bonds may occur not only with crystals—in other words, in solids with long-range order—but also in amorphous solids where the atoms are in a random arrangement. In this case there will be bonding only between a few individual atoms, that is short-range order, and not in a long-range order extending over a large number of atoms. The bond types have a considerable influence on the material properties of amorphous carbon films. If the $sp^2$ type is predominant the DLC film may be softer, whereas if the $sp^3$ type is predominant, the DLC film may be harder.

Figure 5:
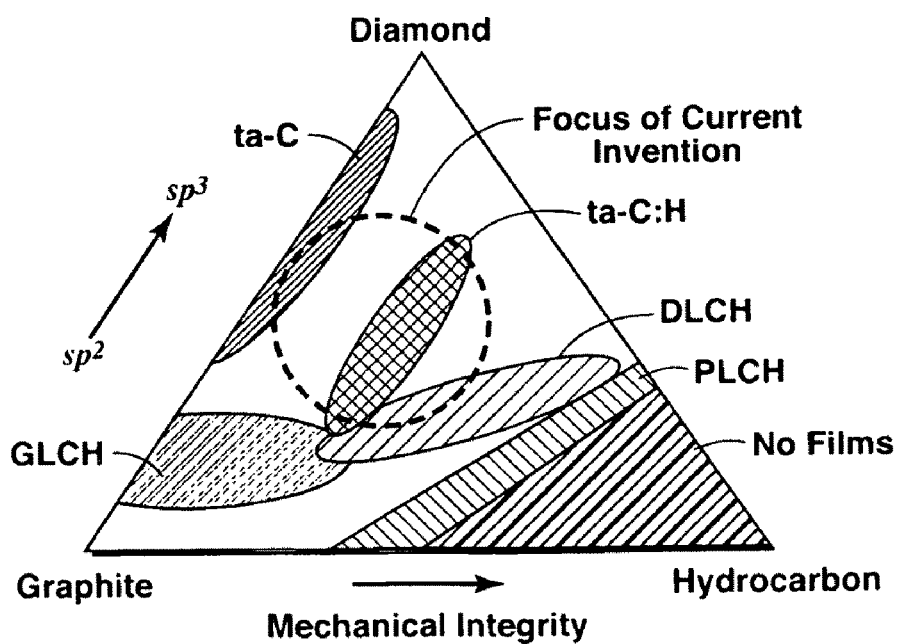
FIG. 5 depicts a ternary phase diagram of amorphous carbons.

DLC coatings may be fabricated as amorphous, flexible, and yet purely $sp^3$ bonded "diamond". The hardest is such a mixture, known as tetrahedral amorphous carbon, or ta-C (see FIG. 5). Such ta-C includes a high volume fraction (~80%) of $sp^3$ bonded carbon atoms. Optional fillers for the DLC coatings, include, but not limited to, hydrogen, graphitic $sp^2$ carbon, and metals, and may be used in other forms to achieve a desired combination of properties depending on the particular application. The various forms of DLC coatings may be applied to a variety of substrates that are compatible with a vacuum environment and that are also electrically conductive. DLC coating quality is also dependent on the fractional content of alloying elements such as hydrogen. Some DLC coating methods require hydrogen or methane as a precursor gas, and hence a considerable percentage of hydrogen may remain in the finished DLC material. In order to further improve their tribological and mechanical properties, DLC films are often modified by incorporating metallic elements (e.g., Ti, Mo, Cr, Ni, W, Cu, Nb, Ta) and other alloying elements (e.g., B, N, Si, O, F, P). For instance, the addition of fluorine (F), and silicon (Si) to the DLC films lowers the surface energy and wettability. The reduction of surface energy in fluorinated DLC (F-DLC) is attributed to the presence of —CF2 and —CF3 groups in the film. However higher F contents may lead to a lower hardness. The addition of Si may reduce surface energy by decreasing the dispersive component of surface energy. Si addition may also increase the hardness of the DLC films by promoting $sp^3$ hybridization in DLC films. Addition of metallic elements (e.g., Ti, Mo, Cr, Ni, W, Cu, Nb, Ta) to the film, as well as the use of such metallic interlayer can reduce the compressive residual stresses resulting in better mechanical integrity of the film upon compressive loading.

The diamond-like phase or $sp^3$ bonded carbon of DLC is a thermodynamically metastable phase while graphite with $sp^2$ bonding is a thermodynamically stable phase. Thus the formation of DLC coating films requires non-equilibrium processing to obtain metastable $sp^3$ bonded carbon. Equilibrium processing methods such as evaporation of graphitic carbon, where the average energy of the evaporated species is low (close to kT where k is Boltzman's constant and T is temperature in absolute temperature scale), lead to the formation of 100% $sp^2$ bonded carbons. The methods disclosed herein for producing DLC coatings require that the carbon in the $sp^3$ bond length be significantly less than the length of the $sp^2$ bond. Hence, the application of pressure, impact, catalysis, or some combination of these at the atomic scale may force $sp^2$ bonded carbon atoms closer together into $sp^3$ bonding. This may be done vigorously enough such that the atoms cannot simply spring back apart into separations characteristic of $sp^2$ bonds. Typical techniques either combine such a compression with a push of the new cluster of $sp^3$ bonded carbon deeper into the coating so that there is no room for expansion back to separations needed for $sp^2$ bonding; or the new cluster is buried by the arrival of new carbon destined for the next cycle of impacts.

The DLC coatings disclosed herein may be deposited by physical vapor deposition, chemical vapor deposition, or plasma assisted chemical vapor deposition coating techniques. The physical vapor deposition coating methods include RF-DC plasma reactive magnetron sputtering, ion beam assisted deposition, cathodic arc deposition and pulsed laser deposition (PLD). The chemical vapor deposition coating methods include ion beam assisted CVD deposition, plasma enhanced deposition using a glow discharge from hydrocarbon gas, using a radio frequency (r.f.) glow discharge from a hydrocarbon gas, plasma immersed ion processing and microwave discharge. Plasma enhanced chemical vapor deposition (PECVD) is one advantageous method for depositing DLC coatings on large areas at high deposition rates. Plasma based CVD coating process is a non-line-of-sight technique, i.e. the plasma conformally covers the part to be coated and the entire exposed surface of the part is coated with uniform thickness. The surface finish of the part may be retained after the DLC coating application. One advantage of PECVD is that the temperature of the substrate part does not increase above about 150° C. during the coating operation. The fluorine-containing DLC (F-DLC) and silicon-containing DLC (Si-DLC) films can be synthesized using plasma deposition technique using a process gas of acetylene ($C_2H_2$) mixed with fluorine-containing and silicon-containing precursor gases respectively (e.g., tetra-fluoro-ethane and hexa-methyl-disiloxane).

The DLC coatings disclosed herein may exhibit coefficients of friction within the ranges earlier described. The ultra-low COF may be based on the formation of a thin graphite film in the actual contact areas. As $sp^3$ bonding is a thermodynamically unstable phase of carbon at elevated temperatures of 600 to 1500° C., depending on the environmental conditions, it may transform to graphite which may function as a solid lubricant. These high temperatures may occur as very short flash (referred to as the incipient temperature) temperatures in the asperity collisions or contacts. An alternative theory for the ultra-low COF of DLC coatings is the presence of hydrocarbon-based slippery film. The tetrahedral structure of a $sp^3$ bonded carbon may result in a situation at the surface where there may be one vacant electron coming out from the surface, that has no carbon atom to attach to (see FIG. 6), which is referred to as a "dangling bond" orbital. If one hydrogen atom with its own electron is put on such carbon atom, it may bond with the dangling bond orbital to form a two-electron covalent bond. When two such smooth surfaces with an outer layer of single hydrogen atoms slide over each other, shear will take place between the hydrogen atoms. There is no chemical bonding between the surfaces, only very weak van der Waals forces, and the surfaces exhibit the properties of a heavy hydrocarbon wax. As illustrated in FIG. 6, carbon atoms at the surface may make three strong bonds leaving one electron in the dangling bond orbital pointing out from the surface. Hydrogen atoms attach to such surface which becomes hydrophobic and exhibits low friction.

The DLC coatings for drill stem assemblies disclosed herein also prevent wear due to their tribological properties. In particular, the DLC coatings disclosed herein are resistant to abrasive and adhesive wear making them suitable for use in applications that experience extreme contact pressure, both in rolling and sliding contact.

In addition to low friction and wear/abrasion resistance, the DLC coatings for drill stem assemblies disclosed herein also exhibit durability and adhesive strength to the outer surface of the body assembly for deposition. DLC coating films may possess a high level of intrinsic residual stress (~1 GPa) which has an influence on their tribological performance and adhesion strength to the substrate (e.g., steel) for deposition. Typically DLC coatings deposited directly on steel surface suffer from poor adhesion strength. This lack of adhesion strength restricts the thickness and the incompatibility between DLC and steel interface, which may result in delamination at low loads. To overcome these problems, the DLC coatings for drill stem assemblies disclosed herein may also include interlayers of various metallic (for example, but not limited to, Cr, W, Ti) and ceramic compounds (for example, but not limited to, CrN, SiC) between the outer surface of the drill stem assembly and the DLC coating layer. These ceramic and metallic interlayers relax the compressive residual stress of the DLC coatings disclosed herein to increase the adhesion and load carrying capabilities. An alternative approach to improving the wear/friction and mechanical durability of the DLC coatings disclosed herein is to incorporate multilayers with intermediate buffering layers to relieve residual stress build-up and/or duplex hybrid coating treatments. In one form, the outer surface of the drill stem assembly for treatment may be nitrided or carburized, a precursor treatment prior to DLC coating deposition, in order to harden and retard plastic deformation of the substrate layer which results in enhanced coating durability.

Multi-Layered Ultra-Low Friction Coatings and Hybrid Ultra-Low Friction Coatings:

Multi-layered ultra-low friction coatings on drill stem assemblies are disclosed herein and may be used in order to maximize the thickness of the ultra-low friction coatings for enhancing their durability for drill stem assemblies used in drilling operations. The coated drill stem assembly for subterraneous rotary drilling operations disclosed herein may include not only a single ultra-low friction layer, but also two or more ultra-low friction coating layers. For example, two, three, four, five or more ultra-low friction coating layers may be deposited on portions of the drill stem assembly. Each ultra-low friction coating layer may range from 0.5 to 5000 microns in thickness with a lower limit of 0.5, 0.7, 1.0, 3.0, 5.0, 7.0, 10.0, 15.0, or 20.0 microns and an upper limit of 25, 50, 75, 100, 200, 500, 1000, 3000, or 5000 microns. The total thickness of the multi-layered ultra-low friction coating may range from 0.5 to 30,000 microns. The lower limit of the total multi-layered coating thickness may be 0.5, 0.7, 1.0, 3.0, 5.0, 7.0, 10.0, 15.0, or 20.0 microns in thickness. The upper limit of the total multi-layered coating thickness may be 25, 50, 75, 100, 200, 500, 1000, 3000, 5000, 10000, 15000, 20000, or 30000 microns in thickness.

In another embodiment of the coated drill stem assembly for subterraneous rotary drilling operations disclosed herein, the body assembly of the drill stem assembly may include hardbanding on at least a portion of the exposed outer surface to provide enhanced wear resistance and durability to the drill stem assembly. Hence, the one or more ultra-low friction coating layers are deposited on top of the hardbanding to form a hybrid type coating structure. The thickness of hardbanding layer may range from several times that of to equal to the thickness of the outer ultra-low friction coating layer or layers. Non-limiting exemplary hardbanding materials include cermet based materials, metal matrix composites, nanocrystalline metallic alloys, amorphous alloys and hard metallic alloys. Other non-limiting exemplary types of hardbanding include carbides, nitrides, borides, and oxides of elemental tungsten, titanium, niobium, molybdenum, iron, chromium, and silicon dispersed within a metallic alloy matrix. Such hardbanding may be deposited by weld overlay, thermal spraying or laser/electron beam cladding.

The ultra-low friction coatings for use in drill stem assemblies disclosed herein may also include one or more buffer layers (also referred to herein as adhesive layers). The one or more buffer layers may be interposed between the outer surface of the body assembly and the single ultra-low friction layer or the two or more ultra-low friction layers in a multi-layer ultra-low friction coating configuration. The one or more buffer layers may be chosen from the following elements or alloys of the following elements: silicon, titanium, chromium, tungsten, tantalum, niobium, vanadium, zirconium, and/or hafnium. The one or more buffer layers may also be chosen from carbides, nitrides, carbo-nitrides, oxides of the following elements: silicon, titanium, chromium, tungsten, tantalum, niobium, vanadium, zirconium, and/or hafnium. The one or more buffer layers are generally interposed between the hardbanding (when utilized) and one or more ultra-low friction coating layers or between ultra-low friction coating layers. The buffer layer thickness may be a fraction of or approach the thickness of the ultra-low friction coating layer.

In yet another embodiment of the coated drill stem assembly for subterraneous rotary drilling operations disclosed herein, the body assembly may further include one or more buttering layers interposed between the outer surface of the body assembly and the ultra-low friction coating or hardbanding layer on at least a portion of the exposed outer surface to provide enhanced toughness, to minimize any dilution from the substrate steel alloying into the outer coating or hardbanding, and to minimize residual stress absorption. Non-limiting exemplary buttering layers include stainless steel or a nickel based alloy. The one or more buttering layers are generally positioned adjacent to or on top of the body assembly of the drill stem assembly for coating.

In one advantageous embodiment of the coated drill stem assembly for subterraneous rotary drilling operations disclosed herein, multilayered carbon based amorphous coating layers, such as diamond-like-carbon (DLC) coatings, may be applied to following non-limiting exemplary locations in the drill stem assembly: stabilizers and tool joints, to reduce vibration by eliminating or minimizing friction between either rock and stabilizers or, in casing, between casing steel and tool joints. The diamond-like-carbon (DLC) coatings suitable for drill stem assemblies may be chosen from ta-C, ta-C:H, DLCH, PLCH, GLCH, Si-DLC, Me-DLC, N-DLC, O-DLC, B-DLC, F-DLC and combinations thereof. One particularly advantageous DLC coating for such applications is DLCH or ta-C:H. The structure of multi-layered DLC coatings may include individual DLC layers with adhesion or buffer layers between the individual DLC layers. Exemplary adhesion or buffer layers for use with DLC coatings include, but are not limited to, the following elements or alloys of the following elements: silicon, titanium, chromium, tungsten, tantalum, niobium, vanadium, zirconium, and/or hafnium. Other exemplary adhesion or buffer layers for use with DLC coatings include, but are not limited to, carbides, nitrides, carbo-nitrides, oxides of the following elements: silicon, titanium, chromium, tungsten, tantalum, niobium, vanadium, zirconium, and/or hafnium. These buffer or adhesive layers act as toughening and residual stress relieving layers and permit the total DLC coating thickness for multi-layered embodiments to be increased while maintaining coating integrity for durability.

In yet another advantageous form of the coated drill stem assembly for subterraneous rotary drilling operations disclosed herein, to improve the durability, mechanical integrity and downhole performance of relatively thin DLC coating layers, a hybrid coating approach may be utilized wherein one or more DLC coating layers may be deposited on a state-of-the-art hardbanding. This embodiment provides enhanced DLC-hardbanding interface strength and also provides protection to the downhole components against premature wear should the DLC either wear away or delaminate. In another form of this embodiment, an advanced surface treatment may be applied to the steel substrate prior to the application of DLC layer(s) to extend the durability and enhance the wear, friction, fatigue and corrosion performance of DLC coatings. Advanced surface treatments may be chosen from ion implantation, nitriding, carburizing, shot peening, laser and electron beam glazing, laser shock peening, and combinations thereof. Such surface treatment can harden the substrate surface by introducing additional species and/or introduce deep compressive residual stress resulting in inhibition of the crack growth induced by impact and wear damage. In yet another form of this embodiment, one or more buttering layers as previously described may be interposed between the substrate and the hardbanding with one or more DLC coating layers interposed on top of the hardbanding.

Figure 14:
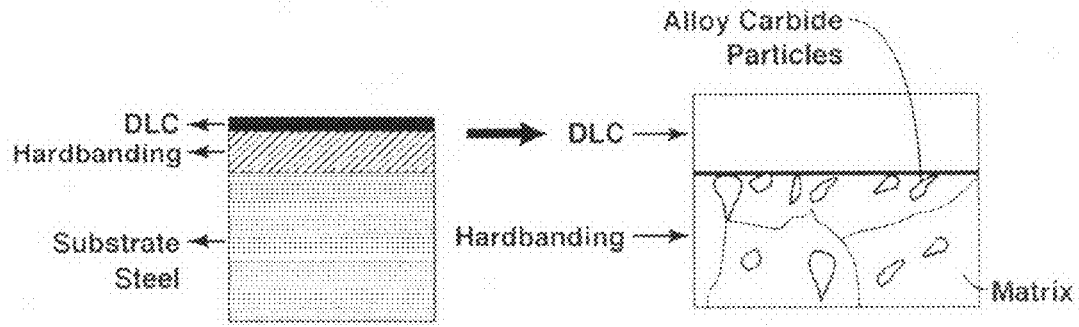
FIG. 14 depicts an exemplary schematic of hybrid DLC coating on hardbanding for drill stem assemblies.

FIG. 14 is an exemplary embodiment of an ultra-low friction coating on a drill stem assembly utilizing multi-layer hybrid coating layers, wherein a DLC coating layer is deposited on top of hardbanding on a steel substrate. In another form of this embodiment, the hardbanding may be post-treated (e.g., etching) to expose the alloy carbide particles to enhance the adhesion of DLC coatings to the hardbanding as also shown in FIG. 14. Such hybrid coatings can be applied to downhole components such as the tool joints and stabilizers to enhance the durability and mechanical integrity of the DLC coatings deposited on these components and to provide a "second line of defense" should the ultra-low friction outer layer either wear-out or delaminate, against the aggressive wear and erosive conditions of the downhole in subterraneaneous rotary drilling operations. In another form of this embodiment, one or more buffer layers and/or one or more buttering layers as previously described may be included within the hybrid coating structure to further enhance properties and performance in particular subterraneous drilling operations.

Drilling Conditions, Applications and Benefits:

The coated drill stem assembly for subterraneous rotary drilling operations disclosed herein includes a body assembly with an exposed outer surface that includes a drill string coupled to a bottom hole assembly or alternatively a coiled tubing coupled to a bottom hole assembly. The drill string includes one or more components chosen from drill pipe, tool joints, transition pipe between the drill string and bottom hole assembly including tool joints, heavy weight drill pipe including tool joints and wear pads, and combinations thereof. The bottom hole assembly includes one or more components chosen from, but not limited to: stabilizers, variable-gauge stabilizers, back reamers, drill collars, flex drill collars, rotary steerable tools, roller reamers, shock subs, mud motors, logging while drilling (LWD) tools, measuring while drilling (MWD) tools, coring tools, under-reamers, hole openers, centralizers, turbines, bent housings, bent motors, drilling jars, acceleration jars, crossover subs, bumper jars, torque reduction tools, float subs, fishing tools, fishing jars, washover pipe, logging tools, survey tool subs, non-magnetic counterparts of these components, associated external connections of these components, and combinations thereof.

The ultra-low friction coating may be deposited on at least a portion of or on all of the drill string, and/or bottom hole assembly, and/or coiled tubing of a drill stem assembly. Hence, it is understood that the ultra-low friction coatings and hybrid forms of the ultra-low friction coating may be deposited on many combinations of the drill string components and/or bottom hole assembly components described above. When coated on the drill string, the ultra-low friction coatings disclosed herein may prevent or delay the onset of drill string buckling including helical buckling for preventing drill stem assembly failures and the associated non-productive time during drilling operations. Moreover, the ultra-low friction coatings disclosed herein may also provide resistance to torsional vibration instability including stick-slip vibration dysfunction of the drill string and bottom hole assembly.

The coated drill stem assemblies disclosed herein may be used during subterraneous rotary drilling operations with downhole temperature ranging from 20 to 400° F. with a lower limit of 20, 40, 60, 80, or 100° F., and an upper limit of 150, 200, 250, 300, 350 or 400° F. The coated drill stem assemblies disclosed herein may be used during subterraneous rotary drilling operations at drilling rotary speeds at the surface ranging from 0 to 200 RPM with a lower limit of 0, 10, 20, 30, 40, or 50 RPM and an upper limit of 100, 120, 140, 160, 180, or 200 RPM. In addition, the coated drill stem assemblies disclosed herein may be used during subterraneous rotary drilling operations with drilling mud pressure during the subterraneous rotary drilling operations ranging from 14 psi to 20,000 psi with a lower limit of 14, 100, 200, 300, 400, 500, or 1000 psi, and an upper limit of 5000, 10000, 15000, or 20000 psi.

The ultra-low friction coatings on drill string assemblies disclosed herein may reduce the required torque for drilling operation, and hence may allow the drilling operator to drill the oil/gas wells at higher rate of penetration (ROP) than when using conventional drilling equipment. In addition, ultra-low friction coatings on drill string assemblies disclosed herein provide wear resistance and low surface energy for the drill stem assembly that is advantageous to that of conventional hardbanded drill stem assemblies while reducing the wear on the well casing.

In one form, the coated drill stem assembly disclosed herein with the ultra-low friction coating on at least a portion of the exposed outer surface of the body assembly provides at least 2 times, or 3 times, or 4 times or 5 times greater wear resistance than an uncoated drill stem assembly. Additionally, the coated drill stem assembly disclosed herein with the ultra-low friction coating on at least a portion of the exposed outer surface of the body assembly provides reduction in casing wear as compared to when an uncoated drill stem assembly is used for rotary drilling. Moreover, the coated drill stem assembly disclosed herein with the ultra-low friction coating on at least a portion of the exposed outer surface of the body assembly reduces casing wear by at least 2 times, or 3 times, or 4 times, or 5 times versus the use of an uncoated drill stem assembly for rotary drilling operations.

The ultra-low friction coatings on drill string assemblies disclosed herein may also eliminate or reduce the velocity weakening of the friction coefficient. More particularly, rotary drilling systems used to drill deep boreholes for hydrocarbon exploration and production often experience severe torsional vibrations leading to instabilities referred to as "stick-slip" vibrations, characterized by (i) sticking phases where the bit or BHA down to bit stops (relative sliding velocity is zero), and (ii) slipping phases where the relative sliding velocity of the above assembly downhole rapidly accelerates to a value much larger than the average sliding velocity imposed by the rotary speed (RPM) imposed at the drilling rig. This problem is particularly acute with drag bits, which consist of fixed blades or cutters mounted on the surface of a bit body. Non-linearities in the constitutive laws of friction lead to the instability of steady frictional sliding against stick-slip oscillations. In particular, velocity weakening behavior, which is indicated by a decreasing coefficient of friction with increasing relative sliding velocity, may cause torsional instability triggering stick-slip vibrations. Sliding instability is an issue in drilling since it is one of the primary founders which limits the maximum rate of penetration as described earlier. In drilling applications, it is advantageous to avoid the stick-slip condition because it leads to vibrations and wear, including the initiation of damaging coupled vibrations. By reducing or eliminating the velocity weakening behavior, the ultra-low friction coatings on drill string assemblies disclosed herein bring the system into the continuous sliding state, where the relative sliding velocity is constant and does not oscillate (avoidance of stick-slip) or display violent accelerations or decelerations in localized RPM. Even with the prior art method of avoiding stick-slip motion with the use of a lubricant additive or pills to drilling muds, at high normal loads and small sliding velocities stick-slip motion may still occur. The ultra-low friction coatings on drill stem assemblies disclosed herein may provide for no stick-slip motion even at high normal loads.

Bit and stabilizer balling occurs when the adhesive forces between the bit and stabilizer surface and rock cutting chips become greater than the cohesive forces holding the chip together. Therefore, in order to decrease bit balling, the adhesive forces between the deformable shale chip and the drill bit and stabilizer surface may be reduced. The ultra-low friction coatings on drill stem assemblies disclosed herein provide low energy surfaces to provide low adherence surfaces for mitigating or reducing bit/stabilizer balling.

Methods for Reducing Friction in Drill Stem Assemblies:

The current invention also relates to methods for reducing friction and wear during subterraneous rotary drilling operations. In one exemplary embodiment, a method for reducing friction in a coated drill stem assembly during subterraneous rotary drilling operations includes providing a coated drill stem assembly including a body assembly with an exposed outer surface including a drill string coupled to a bottom hole assembly or a coiled tubing coupled to a bottom hole assembly, and an ultra-low friction coating on at least a portion of the exposed outer surface of the body assembly, wherein the coefficient of friction of the ultra-low friction coating is less than or equal to 0.15, and utilizing the coated drill stem assembly in subterraneous rotary drilling operations. The subterraneous rotary drilling operations may be directional including, but not limited to, horizontal drilling or extended reach drilling (ERD). During horizontal drilling or extended reach drilling (ERD), the method may also include utilizing bent motors to assist with weight transfer to the drill bit. Weight transfer to the drill bit is facilitated during sliding operations (0 RPM) for directional hole drilling when using such bent motors.

As discussed in detail above, the ultra-low friction coating may be chosen from an amorphous alloy, an electroless nickel-phosphorous composite, graphite, $MoS_2$, $WS_2$, a fullerene based composite, a boride based cermet, a quasicrystalline material, a diamond based material, diamond-like-carbon (DLC), boron nitride, and combinations thereof. The diamond based material may be chemical vapor deposited (CVD) diamond or polycrystalline diamond compact (PDC). In one advantageous embodiment, the coated drill stem assembly for subterraneous rotary drilling operations is coated with an ultra-low friction diamond-like-carbon (DLC) coating, and more particularly the DLC coating may be chosen from ta-C, ta-C:H, DLCH, PLCH, GLCH, Si-DLC, N-DLC, O-DLC, B-DLC, Me-DLC, F-DLC and combinations thereof. In another advantageous form of the DLC coating embodiment, hardbanding is utilized adjacent to the substrate.

In one form of the method for reducing friction in a coated drill stem assembly during subterraneous rotary drilling operations, the one or more components of the drill stem assembly may be coated with diamond-like carbon (DLC). Coatings of DLC materials may be applied by physical vapor deposition (PVD), arc deposition, chemical vapor deposition (CVD), or plasma enhanced chemical vapor deposition (PECVD) coating techniques. The physical vapor deposition coating method may be chosen from sputtering, RF-DC plasma reactive magnetron sputtering, ion beam assisted deposition, cathodic arc deposition and pulsed laser deposition. The one or more DLC coating layers may be advantageously deposited by PECVD and/or RF-DC plasma reactive magnetron sputtering methods.

The method for reducing friction in a coated drill stem assembly during subterraneous rotary drilling operations disclosed herein provides substantial reduction in torque by substantially reducing friction and drag during directional or extended reach drilling facilitating drilling deeper and/or longer reach wells with existing top drive capabilities. Substantial reduction in torque means a 10% reduction, preferably 20% reduction and more preferably 30% as compared to when an uncoated drill stem assembly is used for rotary drilling. Substantially reducing friction and drag means a 10% reduction, preferably 20% reduction and more preferably 50% as compared to when an uncoated drill stem assembly is used for rotary drilling. The method for reducing friction in a coated drill stem assembly may further include applying the ultra-low friction coating on at least a portion of the exposed outer surface of the body assembly at the drilling rig site in the field or at a local supplier shop to apply new or refurbish worn coatings to extend the life and facilitate continued use of the assembly.

In one advantageous form of the method for reducing friction in a coated drill stem assembly during subterraneous rotary drilling operations disclosed herein, the ultra-low friction coating includes diamond-like-carbon (DLC). One exemplary method for applying the diamond-like-carbon (DLC) ultra-low friction coating includes evacuating at least a portion of the exposed outer surface of the body assembly through a means for mechanical sealing and pumping down prior to vapor deposition coating. Either a drill string or coiled tubing may be used in conjunction with the bottom hole assembly to form the drill stem assembly. When utilizing ultra-low friction coated coiled tubing in subterraneous rotary drilling operations with the methods for reducing friction disclosed herein, the method provides for underbalanced drilling to reach targeted total depth without the need for drag reducing additives in the mud.

When utilizing the ultra-low friction coated drill stem assemblies, the method for reducing friction in a coated drill stem assembly during subterraneous rotary drilling operations disclosed herein, provides for substantial friction and drag reduction without compromising the aggressiveness of a drill bit connected to the coated drill stem assembly to transmit applied torque to rock fragmentation process. Substantial friction and drag reduction means that a 10% reduction, preferably 20% reduction and more preferably 50% reduction as compared to when an uncoated drill stem assembly is used for rotary drilling. In addition, the method for reducing friction in a coated drill stem assembly during subterraneous rotary drilling operations disclosed herein, the corrosion resistance of the ultra-low friction coating is at least equal to the steel used for the body assembly of the drill stem assembly in the downhole drilling environments.

Test Methods

Coefficient of friction was measured using ball-on-disk tester according to ASTM G99 test method. The test method requires two specimens—a flat disk specimen and a spherically ended ball specimen. A ball specimen, rigidly held by using a holder, is positioned perpendicular to the flat disk. The flat disk specimen slides against the ball specimen by revolving the flat disk of 2.7 inches diameter in a circular path. The normal load is applied vertically downward through the ball so the ball is pressed against the disk. The specific normal load can be applied by means of attached weights, hydraulic or pneumatic loading mechanisms. During the testing, the frictional forces are measured using a tension-compression load cell or similar force-sensitive devices attached to the ball holder. The friction coefficient can be calculated from the measured frictional forces divided by normal loads. The test was done at room temperature and 150° F. under various testing condition sliding speeds. Quartz or mild steel ball, 4 mm~5 mm diameter, was utilized as a counterface material.

Velocity strengthening or weakening was evaluated by measuring the friction coefficient at various sliding velocities using ball-on-disk friction tester by ASTM G99 test method described above.

Hardness was measured according to ASTM C1327 Vickers hardness test method. The Vickers hardness test method consists of indenting the test material with a diamond indenter, in the form of a right pyramid with a square base and an angle of 136 degrees between opposite faces subjected to a load of 1 to 100 kgf. The full load is normally applied for 10 to 15 seconds. The two diagonals of the indentation left in the surface of the material after removal of the load are measured using a microscope and their average is calculated. The area of the sloping surface of the indentation is calculated. The Vickers hardness is the quotient obtained by dividing the kgf load by the square mm area of indentation. The advantages of the Vickers hardness test are that extremely accurate readings can be taken, and just one type of indenter is used for all types of metals and surface treatments. The hardness of thin coating layer (e.g., less than 100 µm) has been evaluated by nanoindentation wherein the normal load (P) is applied to a coating surface by an indenter with well-known pyramidal geometry (e.g., Berkovich tip, which has a three-sided pyramid geometry). In nanoindentation small loads and tip sizes are used to eliminate or reduce the effect from the substrate, so the indentation area may only be a few square micrometres or even nanometres. During the course of the nanoindentation process, a record of the depth of penetration is made, and then the area of the indent is determined using the known geometry of the indentation tip. The hardness can be obtained by dividing the load (kgf) by the area of indentation (square mm).

Wear performance was measured by the ball on disk geometry according to ASTM G99 test method. The amount of wear, or wear volume loss of the disk and ball is determined by measuring the dimensions of both specimens before and after the test. The depth or shape change of the disk wear track was determined by laser surface profilometry and atomic force microscopy. The amount of wear, or wear volume loss of the ball was determined by measuring the dimensions of specimens before and after the test. The wear volume in ball was calculated from the known geometry and size of the ball.

Water contact angle was measured according to ASTM D5725 test method. The method referred to as "sessile drop method" measures a liquid contact angle goniometer using an optical subsystem to capture the profile of a pure liquid on a solid substrate. A drop of liquid (e.g., water) was placed (or allowed to fall from a certain distance) onto a solid surface. When the liquid settled (has become sessile), the drop retained its surface tension and became ovate against the solid surface. The angle formed between the liquid/solid interface and the liquid/vapor interface is the contact angle. The contact angle at which the oval of the drop contacts the surface determines the affinity between the two substances. That is, a flat drop indicates a high affinity, in which case the liquid is said to wet the substrate. A more rounded drop (by height) on top of the surface indicates lower affinity because the angle at which the drop is attached to the solid surface is more acute. In this case the liquid is said not to wet the substrate. The sessile drop systems employ high resolution cameras and software to capture and analyze the contact angle.

EXAMPLES

Illustrative Example 1

DLC coatings were applied on 4142 steel substrates by vapor deposition technique. DLC coatings had a thickness ranging from 1.5 to 25 micrometers. The hardness was measured to be in the range of 1,300 to 7,500 Vickers Hardness Number. Laboratory tests based on ball on disk geometry have been conducted to demonstrate the friction and wear performance of the coating. Quartz ball and mild steel ball were used as counterface materials to simulate open hole and cased hole conditions respectively. In one ambient temperature test, uncoated 4142 steel, DLC coating and commercial state-of-the-art hardbanding weld overlay coating were tested in "dry" or ambient air condition against quartz counterface material at 300 g normal load and 0.6 m/sec sliding speed to simulate an open borehole condition. Up to 10 times improvement in friction performance (reduction of friction coefficient) over uncoated 4142 steel and hardbanding could be achieved in DLC coatings as shown in FIG. 7.

In another ambient temperature test, uncoated 4142 steel, DLC coating and commercial state-of-the-art hardbanding weld overlay coating were tested against mild steel counterface material to simulate a cased hole condition. Up to three times improvement in friction performance (reduction of friction coefficient) over uncoated 4142 steel and hardbanding could be achieved in DLC coatings as shown in FIG. 7. The DLC coating polished the quartz ball due to higher hardness of DLC coating than that of counterface materials (i.e., quartz and mild steel). However, the volume loss due to wear was minimal in both quartz ball and mild steel ball. On the other hand, the plain steel and hardbanded disks caused significant wear in both the quartz and mild steel balls, indicating that these are not very "casing friendly".

Figure 8:
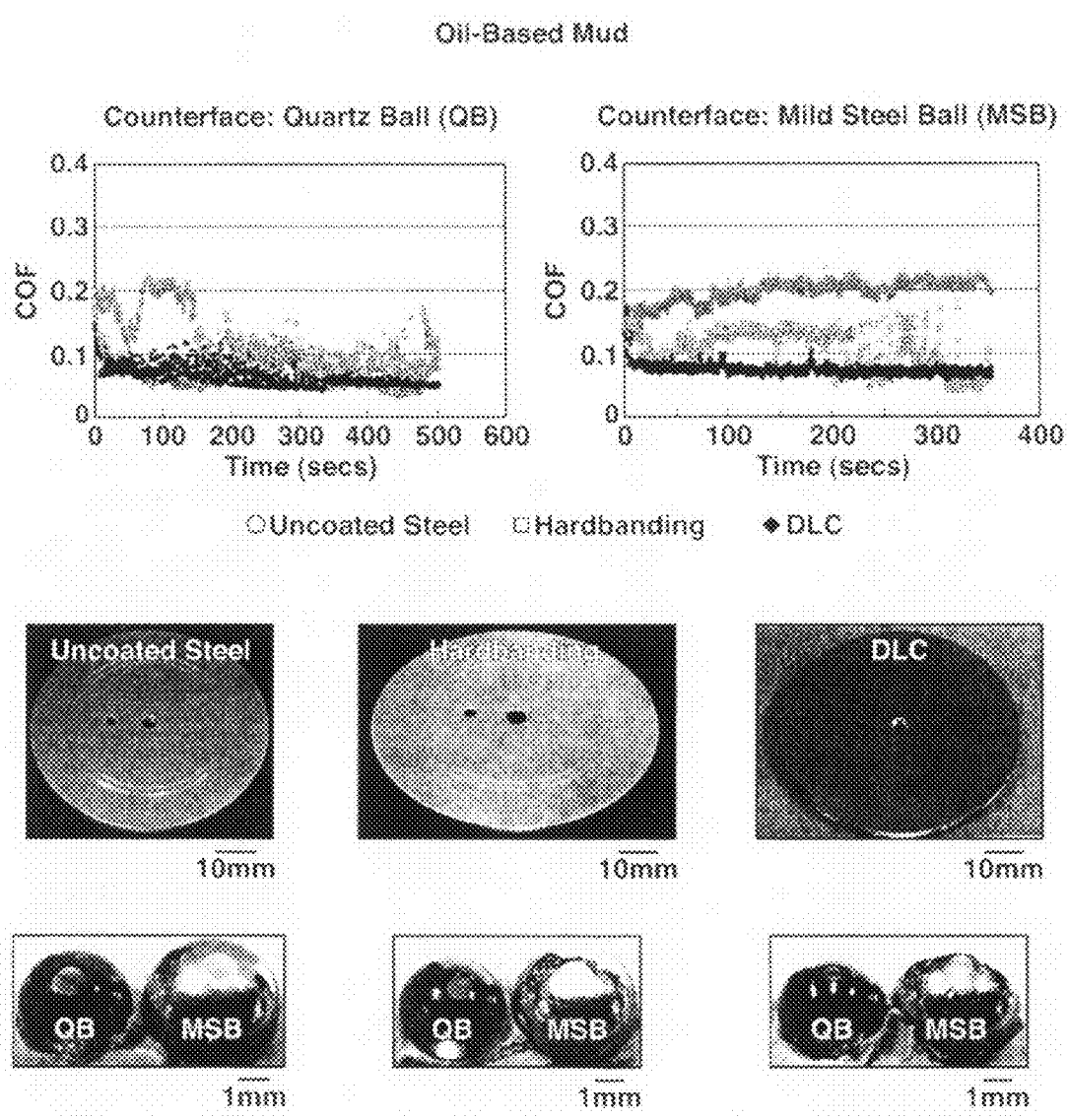
FIG. 8 depicts the friction and wear performance of the DLC coating in oil based mud.

Ball on disk wear and friction coefficient were also tested at ambient temperature in oil based mud. Quartz ball and mild steel balls were used as counterface materials to simulate open hole and cased hole respectively. The DLC coating exhibited significant advantages over commercial hardbanding as shown in FIG. 8. Up to 30% improvement in friction performance (reduction of friction coefficient) over uncoated 4142 steel and hardbanding could be achieved with DLC coatings. The DLC coating polished the quartz ball due to its higher hardness than that of quartz. On the other hand, for the case of uncoated steel disk, both the mild steel and quartz balls as well as the steel disc showed significant wear. For a comparable test, the wear behavior of hardbanded disk was intermediate to that of DLC coated disc and the uncoated steel disc.

Figure 9:
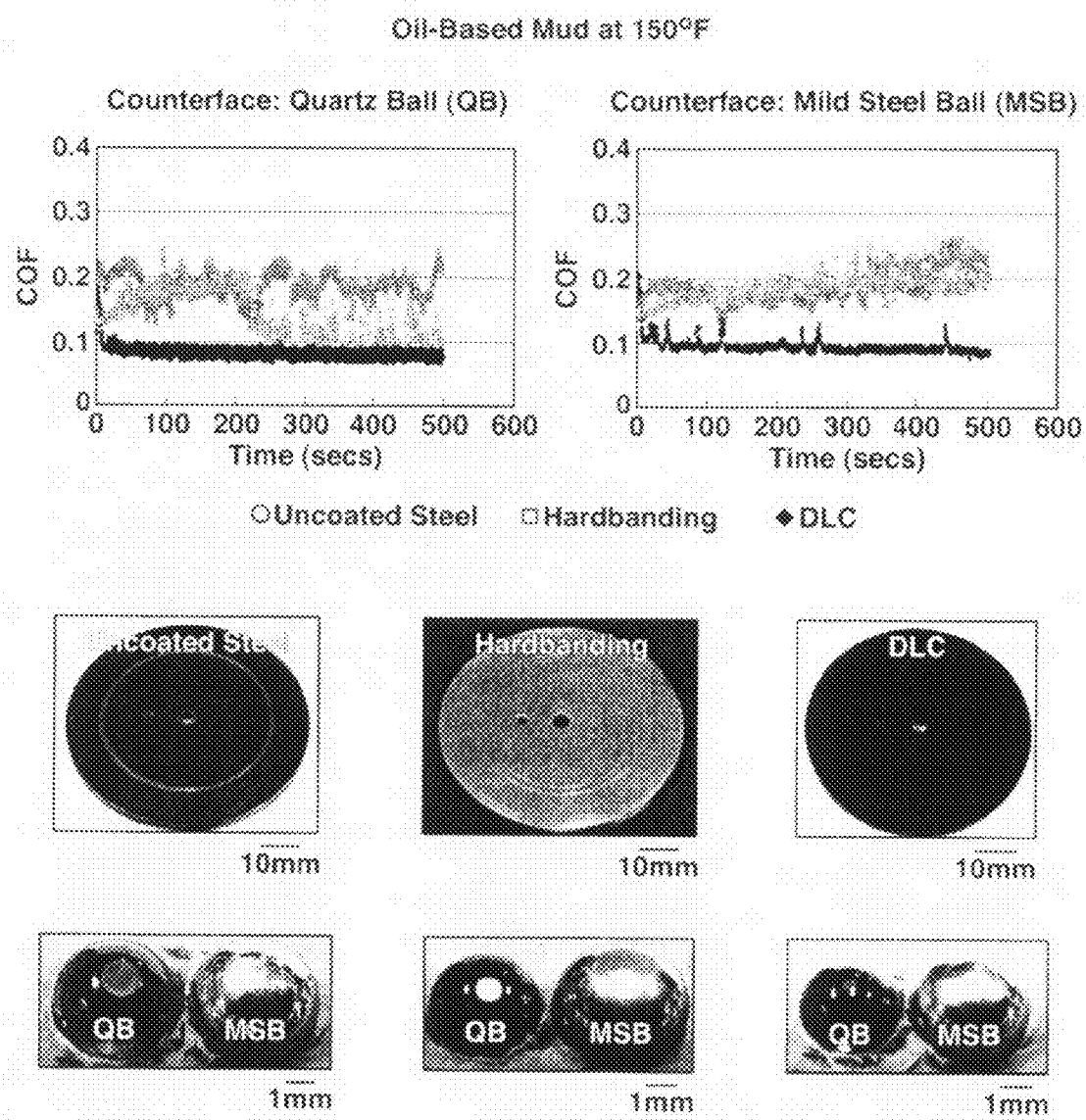
FIG. 9 depicts the friction and wear performance of DLC coating at elevated temperature (150° F.) sliding wear test in oil based mud.

FIG. 9 depicts the wear and friction performance at elevated temperatures. The tests were carried out in oil based mud heated to 150° F., and again the quartz ball and mild steel ball were used as counterface materials to simulate an open hole and cased hole condition respectively. DLC coatings exhibited up to 50% improvement in friction performance (reduction of friction coefficient) over uncoated 4142 steel and commercial hardbanding. Uncoated steel and hardbanding caused wear damage in the counterface materials of quartz and mild steel ball, whereas, significantly lower wear damage has been observed in the counterface materials rubbed against the DLC coating.

Figure 10:
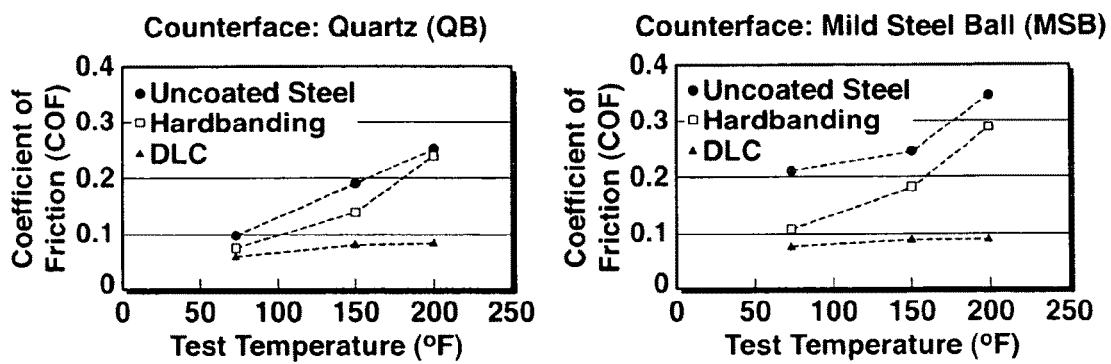
FIG. 10 shows the friction performance of DLC coatings at elevated temperature in oil based mud.

FIG. 10 shows the friction performance of DLC coating at elevated temperature (150° F. and 200° F.) in oil based mud. In this test data, the DLC coatings exhibited low friction coefficient at elevated temperature up to 200° F. However, the friction coefficient of uncoated steel and hardbanding increased significantly with temperature.

Illustrative Example 2

Figure 11:
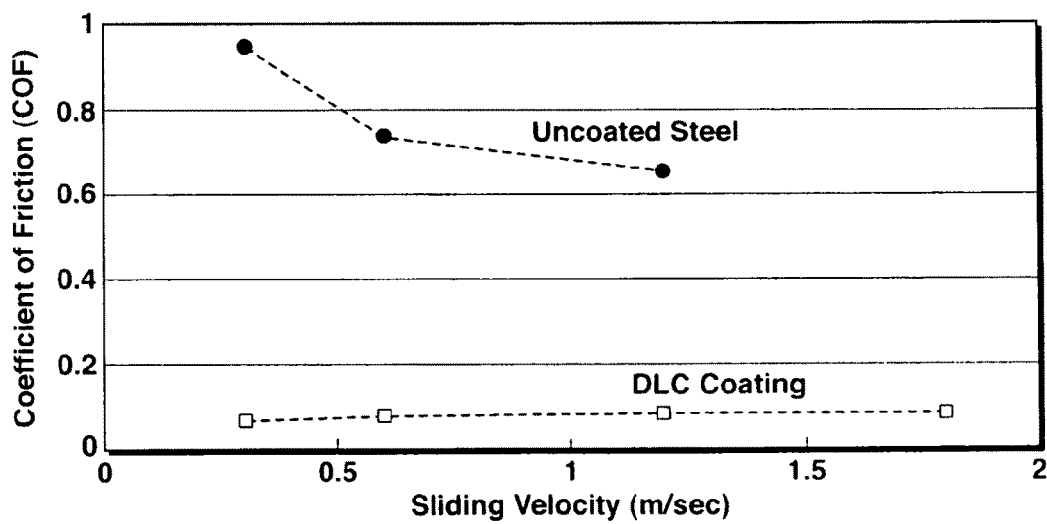
FIG. 11 compares the velocity-weakening performance of DLC coating with the uncoated bare steel substrate.

In the laboratory wear/friction testing, the velocity dependence (velocity weakening or strengthening) of the friction coefficient for a DLC coating and uncoated 4142 steel was measured by monitoring the shear stress required to slide at a range of sliding velocity of 0.3 m/sec~1.8 m/sec. Quartz ball was used as a counterface material in the dry sliding wear test. The velocity-weakening performance of the DLC coating relative to uncoated steel is depicted in FIG. 11. Uncoated 4142 steel exhibits a decrease of friction coefficient with sliding velocity (i.e. significant velocity weakening), whereas DLC coatings show no velocity weakening and indeed, there seems to be a slight velocity strengthening of COF (i.e. slightly increasing COF with sliding velocity), which may be advantageous for mitigating torsional instability, a precursor to stick-slip vibrations.

Illustrative Example 3

Figure 12:
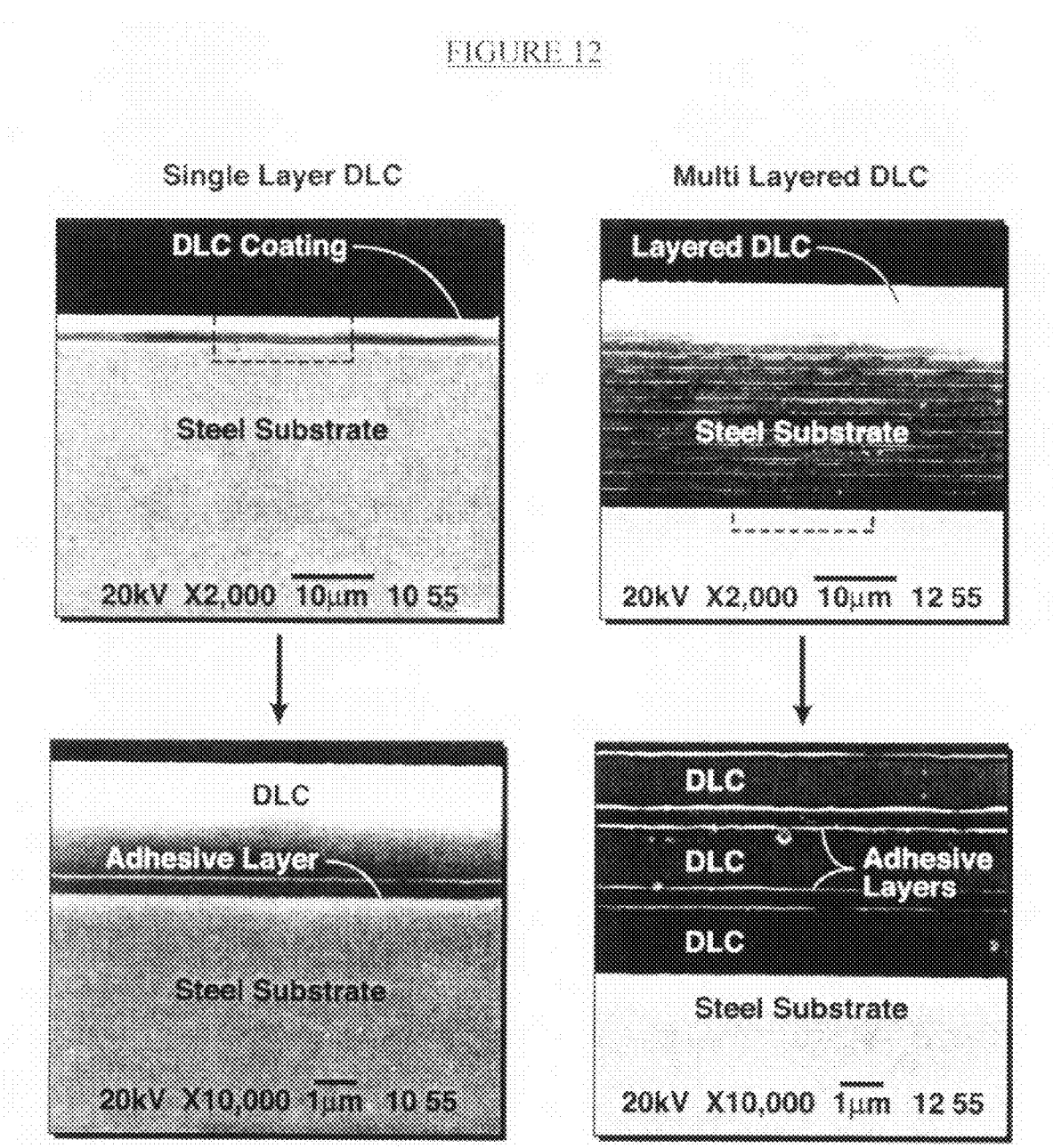
FIG. 12 depicts SEM cross-sections of single layer and multi-layered DLC coatings disclosed herein.

Multi-layered DLC coatings were produced in order to maximize the thickness of the DLC coatings for enhancing their durability for drill stem assemblies used in drilling operations. In one form, the total thickness of the multi-layered DLC coating varied from 6 µm to 25 µm. FIG. 12 depicts SEM images of both single layer and multilayer DLC coatings for drill stem assemblies produced via PECVD. An adhesive layer(s) used with the DLC coatings was a siliceous buffer layer.

Illustrative Example 4

Figure 13:
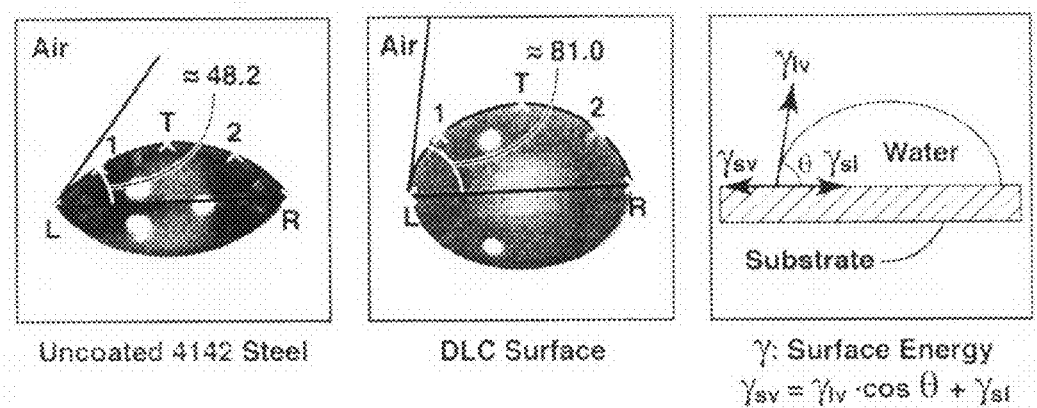
FIG. 13 depicts water contact angle for DLC coatings versus uncoated 4142 steel.

The surface energy of DLC coated substrates in comparison to an uncoated 4142 steel surface was measured via water contact angle. Results are depicted in FIG. 13 and indicate that a DLC coating provides a substantially lower surface energy in comparison to an uncoated steel surface. The lower surface energy may provide lower adherence surfaces for mitigating or reducing bit/stabilizer balling.

Applicants have attempted to disclose all embodiments and applications of the disclosed subject matter that could be reasonably foreseen. However, there may be unforeseeable, insubstantial modifications that remain as equivalents. While the present invention has been described in conjunction with specific, exemplary embodiments thereof, it is evident that many alterations, modifications, and variations will be apparent to those skilled in the art in light of the foregoing description without departing from the spirit or scope of the present disclosure. Accordingly, the present disclosure is intended to embrace all such alterations, modifications, and variations of the above detailed description.

All patents, test procedures, and other documents cited herein, including priority documents, are fully incorporated by reference to the extent such disclosure is not inconsistent with this invention and for all jurisdictions in which such incorporation is permitted.

When numerical lower limits and numerical upper limits are listed herein, ranges from any lower limit to any upper limit are contemplated.

What is claimed is:

1. A coated drill stem assembly for subterranean rotary drilling operations comprising:
   a body assembly with an exposed outer surface including a drill string coupled to a bottom hole assembly or a coiled tubing coupled to a bottom hole assembly and
   an ultra-low friction coating on at least a portion of the exposed outer surface of the body assembly, wherein the coefficient of friction of the ultra-low friction coating is less than or equal to 0.15,
   wherein the ultra-low friction coating is diamond-like-carbon (DLC) and provides resistance to casing wear at least 3 times greater than an uncoated drill stem assembly.

2. The coated drill stem assembly of claim 1, wherein the diamond-like-carbon (DLC) is chosen from to-C, ta-C:H, DLCH, PLCH, GLCH, Si-DLC, N-DLC, O-DLC, B-DLC, Me-DLC, F-DLC and combinations thereof.

3. The coated drill stem assembly of claim 1, wherein the ultra-low friction coating provides a surface energy less than 1 J/m$^2$ to mitigate sticking or balling by rock cuttings during subterranean rotary drilling operations.

4. The coated drill stem assembly of claim 3, wherein the ultra-low friction coating provides a surface energy less than 0.1 J/m².

5. The coated drill stem assembly of claim 3, wherein the ultra-low friction coating on at least a portion of the exposed outer surface of the body assembly provides a hardness greater than 400 VHN to provide for drilling in shales with water based muds and the use of spiral stabilizers.

6. The coated drill stem assembly of claim 1, wherein the water contact angle of the ultra-low friction coating is greater than 60 degrees.

7. The coated drill stem assembly of claim 6, wherein the water contact angle of the ultra-low friction coating is greater than 80 degrees.

8. The coated drill stem assembly of claim 1, wherein the ultra-low friction coating comprises a single ultra-low friction layer or two or more ultra-low friction layers.

9. The coated drill stem assembly of claim 8, wherein the ultra-low friction coating comprises two or more ultra-low friction layers, wherein the two or more ultra-low friction layers are of substantially the same or different ultra-low friction coatings.

10. The coated drill stem assembly of claim 8, wherein the thickness of the single ultra-low friction layer and of each layer of the two or more ultra-low friction layers ranges from 0.5 microns to 5000 microns.

11. The coated drill stem assembly of claim 8, wherein the ultra-low friction coating further comprises one or more buffer layers.

12. The coated drill stem assembly of claim 11, wherein the one or more buffer layers are interposed between the outer surface of the body assembly and the single ultra-low friction layer or the two or more ultra-low friction layers.

13. The coated drill stem assembly of claim 11, wherein the one or more buffer layers are chosen from elements, alloys, carbides, nitrides, carbo-nitrides, and oxides of silicon, titanium, chromium, tungsten, tantalum, niobium, vanadium, zirconium, or hafnium.

14. The coated drill stem assembly of claim 1, wherein the drill string comprises one or more components chosen from drill pipe, tool joints, transition pipe between the drill string and bottom hole assembly, and combinations thereof.

15. The coated drill stem assembly of claim 1, wherein the bottom hole assembly comprises one or more components chosen from stabilizers, variable-gauge stabilizers, back reamers, drill collars, flex drill collars, rotary steerable tools, roller reamers, shock subs, mud motors, logging while drilling (LWD) tools, measuring while drilling (MWD) tools, coring tools, under-reamers, hole openers, centralizers, turbines, bent housings, bent motors, drilling jars, accelerator jars, crossover subs, bumper jars, torque reduction subs, float subs, fishing tools, fishing jars, washover pipe, logging tools, survey tool subs, non-magnetic counterparts of these components, associated external connections of these components, and combinations thereof.

16. The coated drill stem assembly of claim 1, wherein the dynamic friction coefficient of the ultra-low friction coating is not lower than 50% of the static friction coefficient of the ultra-low friction coating.

17. The coated drill stem assembly of claim 16, wherein the dynamic friction coefficient of the ultra-low friction coating is not lower than about 80% of the static friction coefficient of the ultra-low friction coating.

18. The coated drill stem assembly of claim 1, wherein the dynamic friction coefficient of the ultra-low friction coating is greater than or equal to the static friction coefficient of the ultra-low friction coating.

19. The coated drill stem assembly of claim 1, wherein the ultra-low friction coating on at least a portion of the exposed outer surface of the body assembly prevents or delays the onset of drill string buckling.

20. The coated drill stem assembly of claim 1, wherein the downhole temperature during the subterraneous rotary drilling operations ranges from 20 to 400° F.

21. The coated drill stem assembly of claim 1, 16 or 18, wherein the drilling rotary speed at the surface during the subterraneous rotary drilling operations ranges from 0 to 200 RPM.

22. The coated drill stem assembly of claim 1, 16 or 18, wherein the drilling mud pressure during the subterraneous rotary drilling operations ranges from 14 psi to 20,000 psi.

23. The coated drill stem assembly of claim 16 or 18, wherein the ultra-low friction coating provides resistance to torsional vibration instability including stick-slip vibration dysfunction of the drill string and bottom hole assembly.

24. The coated drill stem assembly of claim 1, wherein the ultra-low friction coating on at least a portion of the exposed outer surface of the body assembly provides a hardness greater than 400 VHN.

25. The coated drill stem assembly of claim 24, wherein the ultra-low friction coating on at least a portion of the exposed outer surface of the body assembly provides a hardness greater than 1500 VHN.

26. The coated drill stem assembly of claim 1, wherein the ultra-low friction coating on at least a portion of the exposed outer surface of the body assembly provides at least 3 times greater wear resistance than an uncoated drill stem assembly.

27. The coated drill stem assembly of claim 1, wherein the body assembly further includes hardbanding on at least a portion of the exposed outer surface to provide enhanced wear resistance and durability to the drill stem assembly.

28. The coated drill stem assembly of claim 27, wherein the hardbanding comprises a cermet based material, a metal matrix composite or a hard metallic alloy.

29. The coated drill stem assembly of claim 1 or 27, wherein the body assembly further includes a buttering layer interposed between the outer surface of the body assembly and the ultra-low friction coating or hardbanding on at least a portion of the exposed outer surface to provide enhanced toughness and residual stress absorption.

30. The coated drill stem assembly of claim 29, wherein the buttering layer comprises a stainless steel or a nickel based alloy.

31. A method for reducing friction in a coated drill stem assembly during subterraneous rotary drilling operations comprising:
providing a coated drill stem assembly comprising a body assembly with an exposed outer surface including a drill string coupled to a bottom hole assembly or a coiled tubing coupled to a bottom hole assembly, and an ultra-low friction coating on at least a portion of the exposed outer surface of the body assembly, wherein the coefficient of friction of the ultra-low friction coating is less than or equal to 0.15, and
utilizing the coated drill stem assembly in subterraneous rotary drilling operations,
wherein the ultra-low friction coating is diamond-like-carbon (DLC) and provides resistance to casing wear at least 3 times greater than an uncoated drill stem assembly.

32. The method of claim 31, wherein the subterraneous rotary drilling operations are directional including horizontal drilling or extended reach drilling (ERD).

33. The method of claim 32, further including utilizing bent motors or rotary steerable tools during horizontal drilling or extended reach drilling (ERD) to assist with directional control.

34. The method of claim 31, wherein the diamond-like-carbon (DLC) is chosen from to-C, ta-C:H, DLCH, PLCH, GLCH, Si-DLC, N-DLC, O-DLC, B-DLC, Me-DLC, F-DLC and combinations thereof.

35. The method of claim 31, wherein the diamond-like-carbon (DLC) is applied by physical vapor deposition, chemical vapor deposition, or plasma assisted chemical vapor deposition coating techniques.

36. The method of claim 35, wherein the physical vapor deposition coating method is chosen from RF-DC plasma reactive magnetron sputtering, ion beam assisted deposition, cathodic arc deposition and pulsed laser deposition.

37. The method of claim 31, wherein the ultra-low friction coating provides a surface energy less than 1 $J/m^2$ to mitigate sticking or balling by rock cuttings during subterraneous rotary drilling operations.

38. The method of claim 37, wherein the ultra-low friction coating on at least a portion of the exposed outer surface of the body assembly provides a hardness greater than 400 VHN to provide for drilling in shales with water based muds and the use of spiral stabilizers.

39. The method of claim 31, wherein the water contact angle of the ultra-low friction coating is greater than 60 degrees.

40. The method of claim 31, wherein the ultra-low friction coating comprises a single ultra-low friction layer or two or more ultra-low friction layers.

41. The method of claim 40, wherein the ultra-low friction coating comprises two or more ultra-low friction layers, wherein the two or more ultra-low friction layers are of substantially the same or different ultra-low friction coatings.

42. The method of claim 40, wherein the thickness of the single ultra-low friction layer and of each layer of the two or more ultra-low friction layers ranges from 0.5 microns to 5000 microns.

43. The method of claim 40, wherein the ultra-low friction coating further comprises one or more buffer layers.

44. The method of claim 43, wherein the one or more buffer layers are interposed between the outer surface of the body assembly and the single ultra-low friction layer or the two or more ultra-low friction layers.

45. The method of claim 43, wherein the one or more buffer layers are chosen from elements, alloys, carbides, nitrides, carbo-nitrides, and oxides of silicon, titanium, chromium, tungsten, tantalum, niobium, vanadium, zirconium, or hafnium.

46. The method of claim 31, wherein the drill string comprises one or more components chosen from drill pipe, tool joints, transition pipe between the drill string and bottom hole assembly, and combinations thereof.

47. The method of claim 31, wherein the bottom hole assembly comprises one or more components chosen from stabilizers, variable-gauge stabilizers, back reamers, drill collars, flex drill collars, rotary steerable tools, roller reamers, shock subs, mud motors, logging while drilling (LWD) tools, measuring while drilling (MWD) tools, coring tools, under-reamers, hole openers, centralizers, turbines, bent housings, bent motors, drilling jars, accelerator jars, crossover subs, bumper jars, torque reduction subs, float subs, fishing tools, fishing jars, washover pipe, logging tools, survey tool subs, non-magnetic counterparts of any of these components, associated external connections of these components, and combinations thereof.

48. The method of claim 31, wherein the dynamic friction coefficient of the ultra-low friction coating is not lower than 50% of the static friction coefficient of the ultra-low friction coating.

49. The method of claim 31, wherein the dynamic friction coefficient of the ultra-low friction coating is greater than or equal to the static friction coefficient of the ultra-low friction coating.

50. The method of claim 31 wherein the downhole temperature during the subterraneous rotary drilling operations ranges from 20 to 400° F.

51. The method of claim 31, 48 or 49, wherein the drilling rotary speed at the surface during the subterraneous rotary drilling operations ranges from 0 to 200 RPM.

52. The method of claim 31, 48 or 49, wherein the drilling mud pressure during the subterraneous rotary drilling operations ranges from 14 psi to 20,000 psi.

53. The method of claim 48 or 49, wherein the ultra-low friction coating provides resistance to torsional vibration instability including stick-slip vibration dysfunction of the drill string and bottom hole assembly.

54. The method of claim 31, wherein the ultra-low friction coating on at least a portion of the exposed outer surface of the body assembly provides a hardness greater than 400 VHN.

55. The method of claim 31, wherein the ultra-low friction coating on at least a portion of the exposed outer surface of the body assembly provides at least 3 times greater wear resistance than an uncoated drill stem assembly.

56. The method of claim 31, wherein the body assembly further includes hardbanding on at least a portion of the exposed outer surface to provide enhanced wear resistance and durability.

57. The method of claim 56, wherein the hardbanding comprises a cermet based material, a metal matrix composite or a hard metallic alloy.

58. The method of claim 31 or 56, wherein the body assembly further includes a buttering layer interposed between the outer surface of the body assembly and the ultra-low friction coating or hardbanding on at least a portion of the exposed outer surface to provide enhanced toughness and residual stress absorption.

59. The method of claim 56, wherein the buttering layer comprises stainless steel or nickel base alloy.

60. The method of claim 31, wherein the ultra-low friction coating on at least a portion of the exposed outer surface of the body assembly provides substantial reduction in torque by substantially reducing friction and drag during directional or extended reach drilling facilitating drilling deeper and/or longer reach wells with existing top drive capabilities.

61. The method of claim 31, further comprising applying the ultra-low friction coating on at least a portion of the exposed outer surface of the body assembly at the drilling rig site in the field or at a local supplier shop to apply new or refurbish worn coatings to extend the life and facilitate continued use of the assembly.

62. The method of claim 31, wherein applying the diamond-like-carbon (DLC) ultra-low friction coating includes evacuating at least a portion of the exposed outer surface of the body assembly through a means for mechanical sealing and pumping down prior to vapor deposition coating.

63. The method of claim 31, wherein the utilizing the coated drill stem assembly with coiled tubing in subterraneous rotary drilling operations provides for underbalanced drilling to reach targeted total depth without the need for drag reducing additives in the mud.

64. The method of claim 31, wherein the utilizing the coated drill stem assembly in subterraneous rotary drilling operations provides for substantial friction and drag reduction without compromising the aggressiveness of a drill bit connected to the coated drill stem assembly to transmit applied torque to rock fragmentation process.

65. The method of claim 31, wherein the corrosion resistance of the ultra-low friction coating is at least equal to the steel used for the body assembly.

66. A coated drill stem assembly for subterraneous rotary drilling operations comprising:
a body assembly with an exposed outer surface including a drill string coupled to a bottom hole assembly or a coiled tubing coupled to a bottom hole assembly,
hardbanding on at least a portion of the exposed outer surface of the body assembly, and
an ultra-low friction coating on at least a portion of the hardbanding, wherein the coefficient of friction of the ultra-low friction coating is less than or equal to 0.15,
wherein the ultra-low friction coating is diamond-like-carbon (DLC) and provides resistance to casing wear at least 3 times greater than an uncoated drill stem assembly.

67. The coated drill stem assembly of claim 66, wherein the diamond-like-carbon (DLC) is chosen from to-C, ta-C:H, DLCH, PLCH, GLCH, Si-DLC, N-DLC, O-DLC, B-DLC, Me-DLC, F-DLC and combinations thereof.

68. The coated drill stem assembly of claim 66, wherein the hardbanding comprises a cermet based material, a metal matrix composite or a hard metallic alloy.

69. The coated drill stem assembly of claim 66, wherein the body assembly further includes a buttering layer interposed between the outer surface of the body assembly and the hardbanding.

70. The coated drill stem assembly of claim 69, wherein the buttering layer comprises a stainless steel or a nickel based alloy.

71. The coated drill stem assembly of claim 66, wherein the ultra-low friction coating comprises a single ultra-low friction layer or two or more ultra-low friction layers.

72. The coated drill stem assembly of claim 71, wherein the ultra-low friction coating comprises two or more ultra-low friction layers, wherein the two or more ultra-low friction layers are of substantially the same or different ultra-low friction coatings.

73. The coated drill stem assembly of claim 71, wherein the thickness of the single ultra-low friction layer and of each layer of the two or more ultra-low friction layers ranges from 0.5 microns to 5000 microns.

74. The coated drill stem assembly of claim 71, wherein the ultra-low friction coating further comprises one or more buffer layers.

75. The coated drill stem assembly of claim 74, wherein the one or more buffer layers are chosen from elements, alloys, carbides, nitrides, carbo-nitrides, and oxides of silicon, titanium, chromium, tungsten, tantalum, niobium, vanadium, zirconium, or hafnium.

76. A method for reducing friction in a coated drill stem assembly during subterraneous rotary drilling operations comprising:
providing a drill stem assembly comprising a body assembly with an exposed outer surface including a drill string coupled to a bottom hole assembly or a coiled tubing coupled to a bottom hole assembly, hardbanding on at least a portion of the exposed outer surface of the body assembly, and an ultra-low friction coating on at least a portion of the hardbanding, wherein the coefficient of friction of the ultra-low friction coating is less than or equal to 0.15, and
utilizing the coated drill stem assembly in subterraneous rotary drilling operations,
wherein the ultra-low friction coating is diamond-like-carbon (DLC) and provides resistance to casing wear at least 3 times greater than an uncoated drill stem assembly.

77. The method of claim 76, wherein the diamond-like-carbon (DLC) is chosen from to-C, ta-C:H, DLCH, PLCH, GLCH, Si-DLC, N-DLC, O-DLC, B-DLC, Me-DLC, F-DLC and combinations thereof.

78. The method of claim 76, wherein the hardbanding comprises a cermet based material, a metal matrix composite or a hard metallic alloy.

79. The method of claim 76, wherein the body assembly further includes a buttering layer interposed between the outer surface of the body assembly and the hardbanding.

80. The method of claim 79, wherein the buttering layer comprises a stainless steel or a nickel based alloy.

81. The method of claim 76, wherein the ultra-low friction coating comprises a single ultra-low friction layer or two or more ultra-low friction layers.

82. The method of claim 81, wherein the two or more ultra-low friction layers are of substantially the same or different ultra-low friction coatings.

83. The method of claim 81, wherein the thickness of the single ultra-low friction layer and of each layer of the two or more ultra-low friction layers ranges from 0.5 microns to 5000 microns.

84. The method of claim 81, wherein the ultra-low friction coating further comprises one or more buffer layers.

85. The method of claim 84, wherein the one or more buffer layers are chosen from elements, alloys, carbides, nitrides, carbo-nitrides, and oxides of silicon, titanium, chromium, tungsten, tantalum, niobium, vanadium, zirconium, or hafnium.

86. The method of claim 76, wherein the subterraneous rotary drilling operations are directional including horizontal drilling or extended reach drilling (ERD).

87. The method of claim 86, further including utilizing bent motors or rotary steerable tools during horizontal drilling or extended reach drilling (ERD) to assist with directional control.

88. The method of claim 76, wherein the diamond-like-carbon (DLC) is applied by physical vapor deposition, chemical vapor deposition, or plasma assisted chemical vapor deposition coating techniques.

89. The method of claim 88, wherein the physical vapor deposition coating method is chosen from RF-DC plasma reactive magnetron sputtering, ion beam assisted deposition, cathodic arc deposition and pulsed laser deposition.

* * * * *